(12) United States Patent
Ono et al.

(10) Patent No.: US 7,514,738 B2
(45) Date of Patent: Apr. 7, 2009

(54) MEMORY CELL AND NONVOLATILE SEMICONDUCTOR MEMORY

(75) Inventors: Takashi Ono, Tokyo (JP); Narihisa Fujii, Tokyo (JP); Kenji Ohnuki, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 18 days.

(21) Appl. No.: 11/523,661

(22) Filed: Sep. 20, 2006

(65) Prior Publication Data

US 2007/0075354 A1 Apr. 5, 2007

(30) Foreign Application Priority Data

Sep. 30, 2005 (JP) .............................. 2005-287777

(51) Int. Cl.
*H01L 29/76* (2006.01)
(52) U.S. Cl. .................. 257/314; 257/322; 257/E21.68
(58) Field of Classification Search ......... 257/314–326, 257/E21.68
See application file for complete search history.

(56) References Cited

U.S. PATENT DOCUMENTS 6,670,240 B2 * 12/2003 Ogura et al. ................. 438/257
6,720,631 B2 * 4/2004 Brigham et al. ............. 257/408
2004/0227177 A1 * 11/2004 Yoshioka et al. ............ 257/314
2005/0036366 A1 2/2005 Ono
2006/0081941 A1 * 4/2006 Iwata et al. .................. 257/379

FOREIGN PATENT DOCUMENTS

JP 2004342927 12/2004
JP 2005064295 3/2005

* cited by examiner

*Primary Examiner*—H. Jey Tsai
(74) *Attorney, Agent, or Firm*—Rabin & Berdo, PC

(57) ABSTRACT

A nonvolatile semiconductor memory has a memory cell structure with a doped semiconductor substrate, a gate electrode, a channel area disposed in the substrate below the gate electrode, a pair of variable resistance areas disposed on opposite sides of the channel area in the substrate, charge storage bodies formed above the variable resistance areas and on the sides of the gate electrode, and highly doped source and drain areas formed on opposite sides of the variable resistance areas in the substrate. The variable resistance areas are doped at a carrier concentration of $5 \times 10^{17}$ cm$^{-3}$ or less to ensure an adequate current difference between the programmed and erased states of the memory cell. The doping of the variable resistance areas differs from the lightly doped drain doping in peripheral circuit areas.

14 Claims, 13 Drawing Sheets

MEMORY CELL AND NONVOLATILE SEMICONDUCTOR MEMORY

BACKGROUND OF THE INVENTION

1. Field of the Invention

The present invention relates to a nonvolatile memory cell and a method of fabricating a nonvolatile semiconductor memory including the memory cell.

2. Description of the Related Art

Memory cells storing charge on both sides of a gate electrode have recently been proposed for use in nonvolatile semiconductor memory devices. Japanese Patent Application Publications No. 2005-64295 and 2004-342927, for example, propose memory cells with the general structure illustrated in FIG. 1. This memory cell 220 is essentially a field-effect transistor with a source area 234 and a drain area 236 formed in a well 212 in a semiconductor substrate 201, which is insulated by a gate insulation film 222 from a polysilicon layer 224 and tungsten silicide layer 225 that constitute a gate electrode 226. The channel area 228 below the gate electrode 226 is flanked by a pair of variable resistance areas 230, 232. Over them is formed a silicon oxide layer 238 and a silicon nitride layer 239 constituting a charge storage body 240 that also lines the sides of the gate electrode 226. A pair of sidewalls 242 complete the structure. The memory cell operates as follows.

When information is written in the charge storage body 240 near the drain area 236, for example, if the charge storage body 240 initially has no stored charge (the 'erased' state), the source area 234 is placed at the ground voltage level, a positive voltage is applied to the drain area 236, and a positive voltage is applied to the gate electrode 226. Hot electrons generated in variable resistance area 232 are selectively injected into the charge storage body 240 near the drain area 236, thereby 'programming' this charge storage body 240.

When information is read from the charge storage body 240 near the drain area 236, the drain area 236 is placed at the ground voltage level, a positive voltage is applied to the source area 234, and a positive voltage is applied to the gate electrode 226. If this charge storage body 240 has been programmed and stores charge, the electric field of the stored charge increases the resistance of variable resistance area 232, making it difficult to supply carriers to the channel area 228, and current flow is suppressed. If the charge storage body 240 is in the erased state, that is, if no charge is stored, then the resistance of variable resistance area 232 is not increased, an adequate number of carriers is supplied to the channel area 228, and adequate current flows. The value of the information ('0' or '1') is determined from the difference in current between the erased and programmed states.

Information is written into and read from the charge storage body 240 near the source area 234 by similar procedures with the source and drain voltages reversed.

Japanese Patent Application Publication No. 2004-342927 discusses advantageous structures of the source and drain areas with particular attention to specific impurity concentrations.

Since the reading of information relies on the difference in current between the erased and programmed states, if this current difference is small, it becomes difficult to distinguish between '0' and '1' information. Even in the nonvolatile semiconductor memories described in Japanese Patent Application Publication No. 2004-342927, means for ensuring an adequate current difference were lacking.

SUMMARY OF THE INVENTION

An object of the present invention is to ensure an adequate read current difference between the erased and programmed states of a nonvolatile semiconductor memory cell having charge storage areas laterally adjacent to the sides of a gate electrode.

The invention provides a memory cell having a semiconductor substrate with a doped surface layer, a gate insulation film formed on the surface layer, a gate electrode formed on the gate insulation film, a channel area disposed in the surface layer below the gate electrode, and a pair of variable resistance areas formed in the surface layer of the substrate on mutually opposite sides of the channel area. The variable resistance areas are doped at a lower carrier concentration than the channel area; the carrier concentration in the variable resistance areas is at most five hundred quadrillion carriers per cubic centimeter ($5 \times 10^{17}$ cm$^{-3}$). A pair of highly doped areas, of a conductive type opposite to the conductive type of the channel area, are disposed on mutually opposite sides of the variable resistance areas. A pair of charge storage bodies are disposed above the variable resistance areas to store charge.

Experimental evidence indicates that a carrier concentration not exceeding $5 \times 10^{17}$ cm$^{-3}$ in the variable resistance areas ensures an adequate read current difference.

In a nonvolatile semiconductor memory device with memory cells of this type, the variable resistance areas correspond generally to the lightly doped drain (LDD) areas of transistors in circuits peripheral to the memory cells, but the variable resistance areas differ from the lightly doped drain areas in having a lower carrier concentration or a shallower depth, or being doped with impurity ions of greater atomic weight or at a lower ion implantation dose, and in that the variable resistance areas may be partly or wholly of the same conductive type as the channel area.

The invention also provides a method of fabricating a memory cell in a semiconductor substrate having a doped surface layer, comprising:

forming a gate insulation film on the surface layer of the semiconductor substrate;

forming a gate electrode on the gate insulation film;

implanting a first impurity of a conductive type opposite to a conductive type of the doped surface layer of the semiconductor substrate at a dose of at least $1 \times 10^{12}$ cm$^{-2}$ and at most $5 \times 10^{12}$ cm$^{-2}$ into the surface layer of the semiconductor substrate, using the gate electrode as a mask, thereby forming a pair of variable resistance areas in parts of the surface layer of the semiconductor substrate not covered by the gate electrode;

forming a charge storage body and a sidewall on at least one side of the gate electrode;

implanting a second impurity of a conductive type opposite to a conductive type of the doped surface layer of the semiconductor substrate at a dose of at least $1 \times 10^{12}$ cm$^{-2}$ and at most $5 \times 10^{12}$ cm$^{-2}$ into the surface layer of the semiconductor substrate, using the gate electrode and the sidewall as a mask, thereby forming a pair of highly doped areas in parts of the surface layer of the substrate not covered by the gate electrode and the sidewall.

The implantation dose of the first impurity is preferably at most $2.3 \times 10^{12}$ cm$^{-2}$.

The first impurity may be arsenic.

Alternatively, the first impurity may be antimony.

The invention further provides a method of fabricating a nonvolatile semiconductor memory in a semiconductor substrate having doped surface layer including a memory cell area and a peripheral area, the method comprising:

forming a first gate insulation film on the surface layer of the semiconductor substrate in the memory cell area and simultaneously forming a second gate insulation film on the surface layer of the semiconductor substrate in the peripheral area;

forming a first gate electrode on the first gate insulation film and simultaneously forming a second gate electrode on the second gate insulation film;

forming a first resist mask covering the semiconductor substrate exterior to the memory cell area;

implanting a first impurity of a conductive type opposite to a conductive type of the doped surface layer of the semiconductor substrate at a dose of at least $1\times10^{12}$ cm$^{-2}$ and at most $5\times10^{12}$ cm$^{-2}$ into the surface layer of the semiconductor substrate, using the first resist mask and the first gate electrode as a mask, thereby forming a pair of variable resistance areas in parts of the surface layer of the semiconductor substrate not covered by the first gate electrode;

removing the first resist mask and forming a second resist mask covering the semiconductor substrate exterior to the peripheral area;

implanting a second impurity of a conductive type opposite to a conductive type of the doped surface layer of the semiconductor substrate into the surface layer of the semiconductor substrate, using the second resist mask and the second gate electrode as a mask, thereby forming a pair of LDD areas in parts of the surface layer of the semiconductor substrate not covered by the second gate electrode;

forming a storage body and a sidewall on at least one side of the first gate electrode and simultaneously forming a storage body and a sidewall on at least one side of the second gate electrode;

forming a third resist mask covering the semiconductor substrate exterior to the memory cell area;

implanting a third impurity of a conductive type opposite to a conductive type of the doped surface layer of the semiconductor substrate into the surface layer of the semiconductor substrate, using the third resist mask, the first gate electrode, and the sidewall on the at least one side of the first gate electrode as a mask, thereby forming a pair of first highly doped areas in parts of the surface layer of the substrate in the memory cell area not covered by the first gate electrode and the sidewall on the at least one side of the first gate electrode;

removing the third resist mask and forming a fourth resist mask covering the semiconductor substrate exterior to the peripheral area; and implanting a fourth impurity of a conductive type opposite to a conductive type of the doped surface layer of the semiconductor substrate into the surface layer of the semiconductor substrate, using the third resist mask, the second gate electrode, and the sidewall on the at least one side of the second gate electrode as a mask, thereby forming a pair of second highly doped areas in parts of the surface layer of the substrate in the peripheral area not covered by the second gate electrode and the sidewall on the at least one side of the second gate electrode.

The first impurity preferably has a heavier atomic weight than the second impurity.

DETAILED DESCRIPTION OF THE INVENTION

Figure 1:
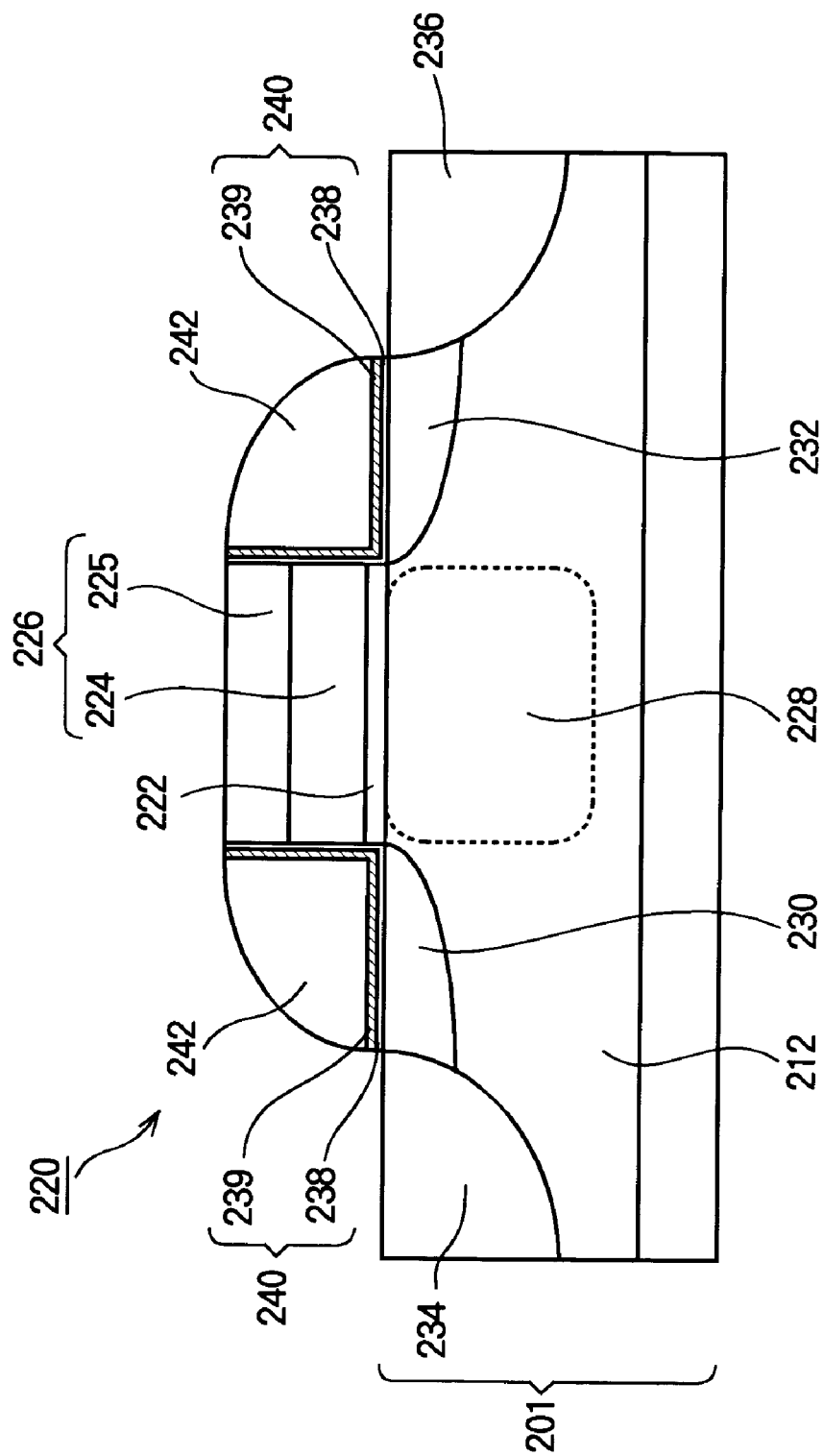
FIG. 1 shows a sectional view of the structure of a conventional nonvolatile semiconductor memory cell.

Embodiments of the invention will now be described with reference to the attached drawings, in which like elements are indicated by like reference characters. The drawings are intended to provide an understanding of the invention but do not necessarily show exact sizes, shapes, and positional relationships, and the invention is not limited to what is illustrated in the drawings.

First Embodiment

Figure 2:
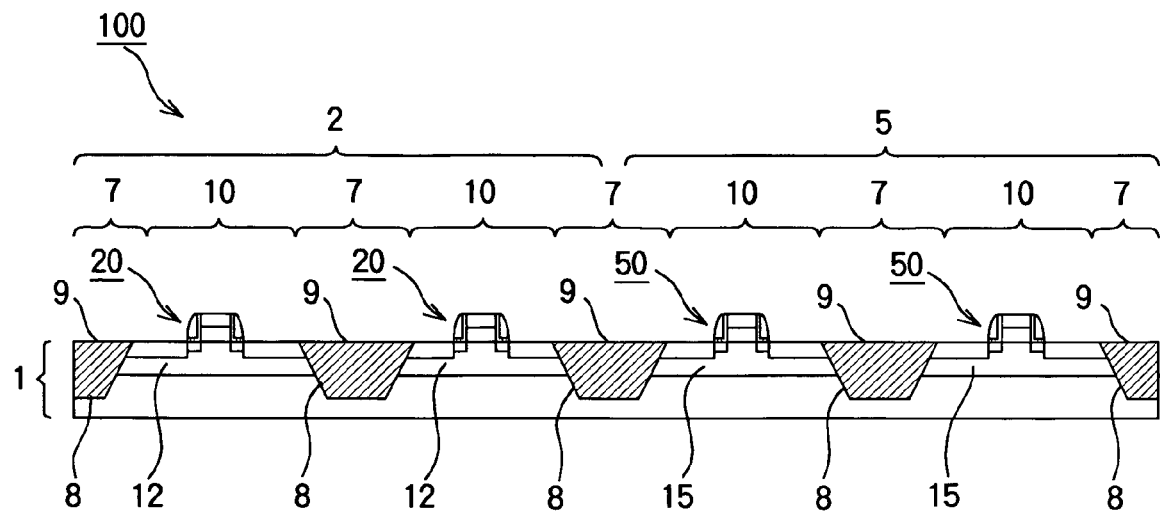
FIG. 2 shows a sectional view of the structure of a nonvolatile semiconductor memory according to a first embodiment of the invention.

Referring to FIG. 2, a first embodiment of the invention is a nonvolatile semiconductor memory 100 formed on a silicon semiconductor substrate 1 doped with a p-type impurity. The memory has a memory cell area 2 in which a plurality of memory cells 20 are formed to store information, and a peripheral area 5 in which a plurality of peripheral transistors 50 are formed to carry out logic operations. The semiconductor substrate 1 may have a silicon-on-sapphire (SOS) structure or some other type of silicon-on-insulator (SOI) structure, such as a structure with a buried oxide layer, or may have a bulk structure or any other type of structure.

In both the memory cell area 2 and the peripheral area 5, the semiconductor substrate 1 is dissected by a plurality of isolation areas 7 formed by the shallow trench isolation (STI) method. In the drawings, each isolation area 7 comprises a trench 8 filled with a silicon oxide film 9 of non-doped silicate glass (NSG). The invention is not limited to this isolation structure however; other isolation methods such as local oxidation of silicon (LOCOS), polysilicon isolation, or air isolation may be used.

The isolation areas 7 divide the semiconductor substrate 1 into a plurality of mutually isolated active areas 10. The part of each active area 10 near the surface of the substrate 1 becomes an electrically isolated p-well 12 doped with a p-type impurity. The memory cells 20 are formed in the active areas 10 in the memory cell area 2; the peripheral transistors 50 are formed in the active areas 10 in the peripheral area 5.

Although the wells in both the memory cell area 2 and the peripheral area 5 are p-type wells in the following description, the invention may also be practiced with n-wells, or with wells of one conductive type in the memory cell area and wells of the opposite conductive type or wells of both conductive types in the peripheral area.

Memory Cell Structure

Figure 3:
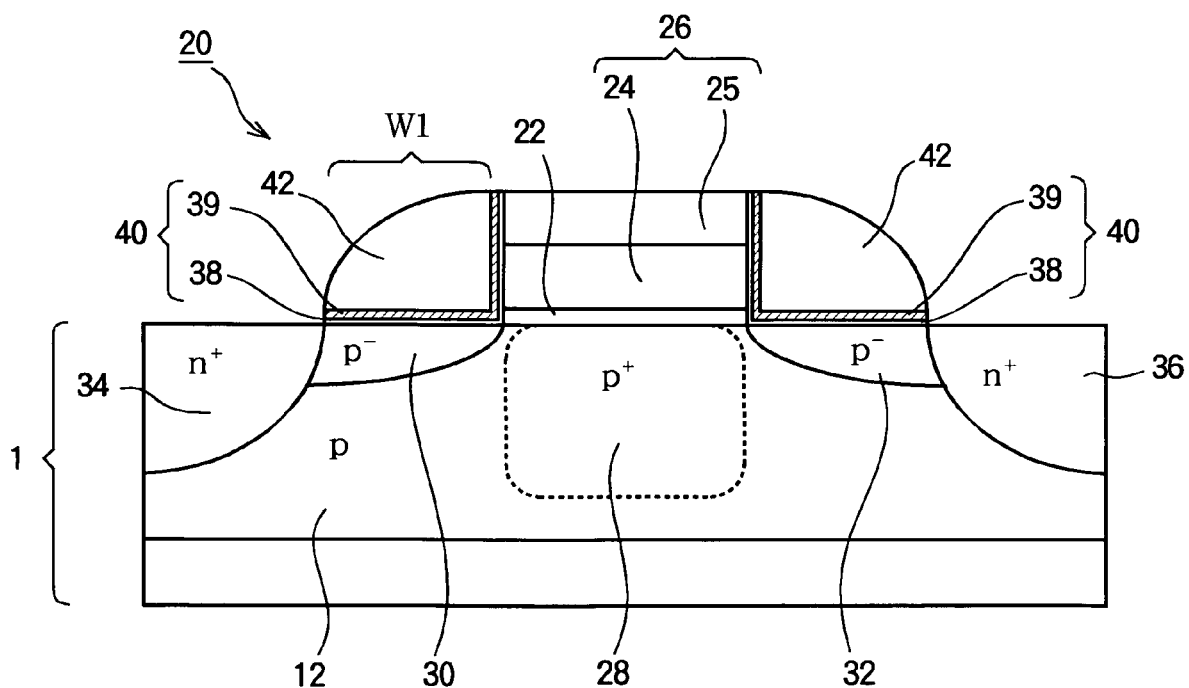
FIG. 3 shows a sectional view of the structure of a memory cell in the first embodiment.

Referring to FIG. 3, the memory cell 20 is an n-channel cell formed in an active area 10 in the memory cell area 2, more specifically in a p-well 12 doped with a p-type impurity. The p-well 12 is formed in the surface area of the semiconductor substrate 1. The part of the substrate below the p-well 12 may be an insulating layer, although this is not a requirement.

A gate insulation film 22 (a first gate insulation film) is formed on the semiconductor substrate 1, and a gate electrode 26 (a first gate electrode) is formed on the gate insulation film 22. The gate electrode 26 is a multilayer film of polysilicon 24 and tungsten silicide 25, and measures 0.16 µm in both length and width.

A channel area 28 (a first channel area) with a relatively high concentration of p-type carriers ($p^+$ doping) is disposed in the surface area of the semiconductor substrate 1 below the gate electrode 26.

A pair of variable resistance areas 30, 32 with a comparatively low carrier concentration are formed on mutually opposite sides of the channel area 28. Each of the variable resistance areas 30, 32 is formed below a charge storage body 40 which will be described later. In the drawing, the variable resistance areas 30, 32 are shown as areas of the p-type, meaning that they are p-type areas doped to have a lower carrier concentration than in the channel area 28 and other parts of the p-well 12. Specifically, the carrier concentration in the variable resistance areas 30, 32 is at most five hundred quadrillion carriers per cubic centimeter ($5 \times 10^{17}$ $cm^{-3}$). Within this carrier concentration limit, the variable resistance areas 30, 32 may be partly n-type areas, as described later.

A source area 34 and a drain area 36, both highly doped with an n-type impurity and both accordingly referred to as first highly doped areas ($n^+$ areas), are formed on mutually opposite sides of the pair of variable resistance areas 30, 32. The carrier concentration in the first highly doped areas 34, 36 is approximately $8 \times 10^{20}$ $cm^{-3}$.

A pair of charge storage bodies 40 are formed on mutually opposite sides of the gate electrode 26 so as to cover the sidewalls of the gate electrode 26 and the surfaces of the variable resistance areas 30, 32. Each charge storage body 40 is a multilayer film comprising a silicon dioxide ($SiO_2$) layer 38 underlying a silicon nitride (SiN) layer 39. To carry out the function of the memory cell 20, the part of the charge storage body 40 that extends laterally on the semiconductor substrate 1 stores charge representing information. In the present embodiment, since a pair of first sidewalls 42 comprising an oxide film are formed above the charge storage bodies 40 as described later, the charge storage bodies 40 may be formed as bi-layer films of $SiO_2$ and SiN. When an oxide film is not used as the first sidewall 42, however (for example, when polysilicon sidewalls are used), it is necessary to form an additional silicon oxide layer on the silicon nitride layer 39, making the charge storage bodies 40 into triple-layer films of $SiO_2$, SiN, and $SiO_2$.

The first sidewalls 42 of NSG are formed on the charge storage bodies 40 on the sides of the gate electrode 26, and function as a mask for forming the source areas 34 and drain areas 36 in the fabrication of the memory cell 20. The width of each first sidewall 42 is denoted W1.

Figure 4:
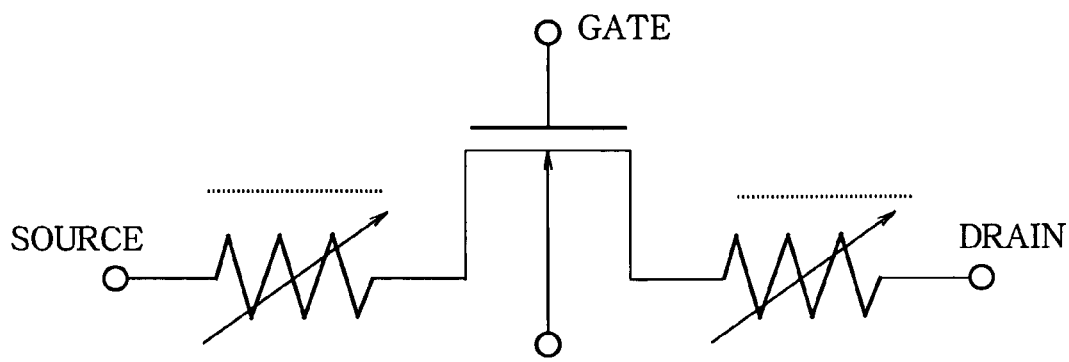
FIG. 4 is an equivalent circuit diagram of the memory cell in FIG. 3.

Referring to the equivalent circuit diagram of the memory cell 20 shown in FIG. 4, the variable resistance areas 30, 32 function as variable resistors connected on mutually opposite sides of the gate.

Peripheral Transistor Structure

Figure 5:
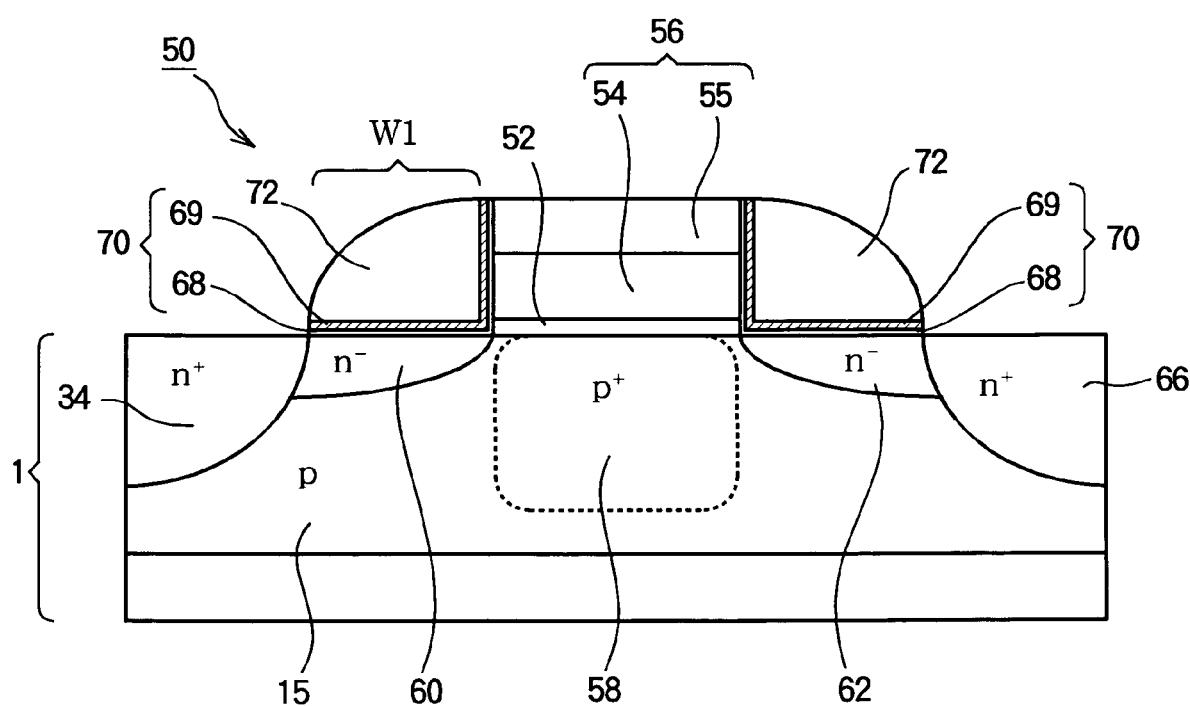
FIG. 5 shows a sectional view of the structure of a peripheral transistor in the first embodiment.

Referring to FIG. 5, each peripheral transistor 50 is an n-channel field-effect transistor formed in an active area 10 in the peripheral area 5, more specifically in a p-well 15, highly doped with a p-type impurity ($p^+$-doping), in the surface area of the semiconductor substrate 1.

A gate insulation film 52 (a second gate insulation film) is formed on the semiconductor substrate 1, and a gate electrode 56 (a second gate electrode) is formed on the gate insulation film 52. The gate electrode 56 comprises a multilayer film of polysilicon 54 and tungsten silicide 55, and has a gate length of 0.20 µm and a gate width of 0.16 µm. The reason why the gate length of the peripheral transistor 50 is longer than in the memory cell 20 is as follow. As described later, the LDD areas 60, 62 in the peripheral area 5 are doped at a higher concentration than the variable resistance areas 30, 32 in the memory cell area 2. Therefore, the effective gate length of the peripheral transistor 50 is shorter, so a physical gate length of about 0.20 µm is required to avoid punch-through.

A $p^+$-type channel area 58 (a second channel area) is disposed in the surface area of the semiconductor substrate 1 below the gate electrode 56.

The LDD areas 60, 62, which are doped with an n-type impurity at a sufficient concentration to become lightly doped n-type areas ($n^-$ areas) are formed on mutually opposite sides of the channel area 58. The meaning of 'lightly' is in relation to the source and drain areas 34, 36. The LDD areas 60, 62 actually have a higher carrier concentration than the channel area 58 and the other p-type parts of the p-well 15. A carrier concentration of at least $1 \times 10^{18}$ $cm^{-3}$ and at most $1 \times 10^{19}$ $cm^{-3}$ is preferred for the LDD areas 60, 62.

The source area 64 and drain area 66, which are both highly doped with an n-type impurity ($n^+$-doping) and will be referred to together as second highly doped areas, are formed on mutually opposite sides of the LDD areas 60, 62 and have a carrier concentration of approximately $1 \times 10^{20}$ $cm^{-3}$.

A pair of multilayer films 70 are formed on mutually opposite sides of the gate electrode 56 so as to cover the sidewalls of the gate electrode 56 and the LDD areas 60, 62. The multilayer films 70 comprise a silicon dioxide ($SiO_2$) layer 68 underlying a silicon nitride (SiN) layer 69. These multilayer films 70 have the same structure as the multilayer films constituting the charge storage bodies 40 in the memory cell area 2, but do not perform the function of storing charge because the peripheral transistors 50 are not operated at the voltages necessary to store charge.

A pair of second sidewalls 72 of silicon dioxide are formed on the multilayer films 70 on the sides of the gate electrode 56, and serve as a mask for forming the source area 64 and drain area 66 in the fabrication of the peripheral transistor 50.

Fabrication Method of Nonvolatile Semiconductor Memory

Next, a method of fabricating the nonvolatile semiconductor memory 100 according to the present embodiment will be described with reference to FIGS. 6 to 15.

Figure 6:
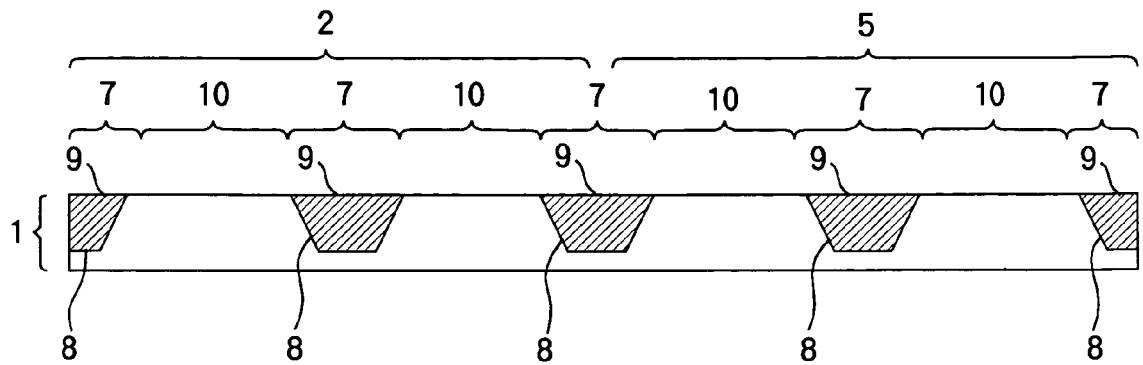
FIGS. 6, 7, 8, 9, 10, 11, 12, 13, 14, and 15 are sectional views illustrating steps in a fabrication process for the nonvolatile semiconductor memory in the first embodiment.

First, as shown in FIG. 6, the isolation areas 7 are formed in the memory cell area 2 and peripheral area 5 of the semiconductor substrate 1 by the STI method. A silicon nitride film (not shown) is grown on the semiconductor substrate 1 by chemical vapor deposition (CVD), then patterned by a well-known photolithography process including photoresist coating, pattern exposure, photoresist development, pattern etching, and photoresist removal. The patterned silicon nitride film is then used as a mask and the semiconductor substrate 1 is etched to form the trenches 8. Next, a silicon oxide (NSG) film 9 is grown by CVD, filling at least the trenches 8, after which the surface of the semiconductor substrate 1 is planarized by a chemical mechanical polishing (CMP) process that removes the silicon nitride film.

In this example, the STI method is used to form the isolation areas 7, but other known isolation methods such as LOCOS, polysilicon isolation, or air isolation may be used.

Figure 7:
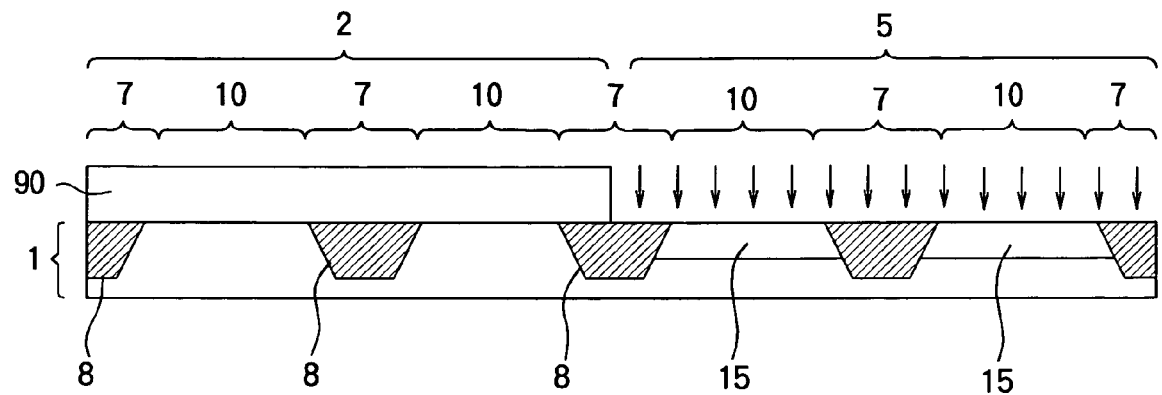

Next, as shown in FIG. 7, p-wells 15 are formed in the active areas 10 in the peripheral area 5, that is, in the surface areas of the semiconductor substrate 1 surrounded by isolation areas 7 in the peripheral area 5. A resist mask 90 is formed covering the area exterior to the peripheral area 5, and then boron (B) ions, which are a p-type impurity, are implanted. The ion implantation energy and dose are one hundred kiloelectron volts (100 keV) and twenty trillion ions per square centimeter ($2 \times 10^{13}$ cm$^{-2}$), respectively. After ion implantation, the resist mask 90 is removed.

Figure 8:
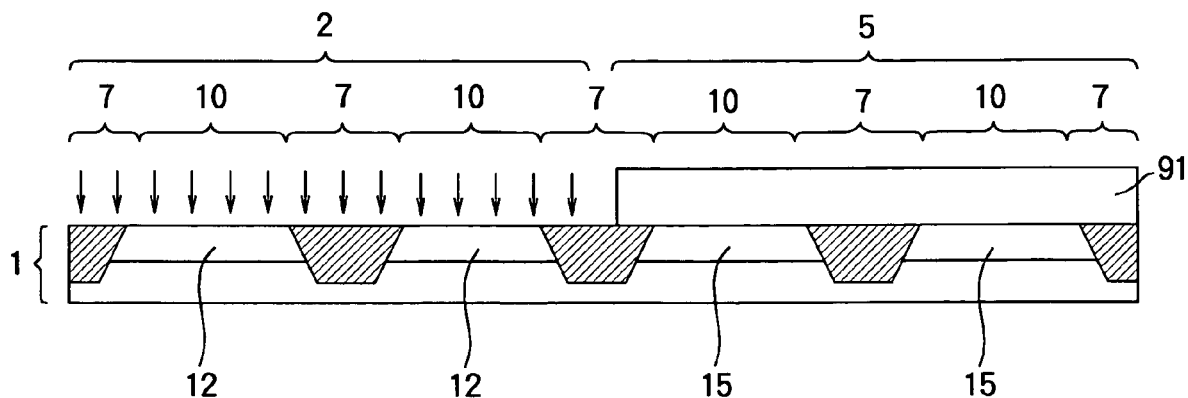

Next, as shown in FIG. 8, p-wells 12 are formed in the active areas 10 in the memory cell area 2. A resist mask 91 is formed covering the area exterior to the memory cell area 2, and then more boron ions are implanted in two steps: a first implantation carried out at an energy of 100 keV and a dose of $3.5 \times 10^{13}$ cm$^{-2}$, and a second implantation carried out at an energy of 30 keV and a dose of $1 \times 10^{13}$ cm$^{-2}$. After these ion implantation steps, the resist mask 91 is removed.

Figure 9:
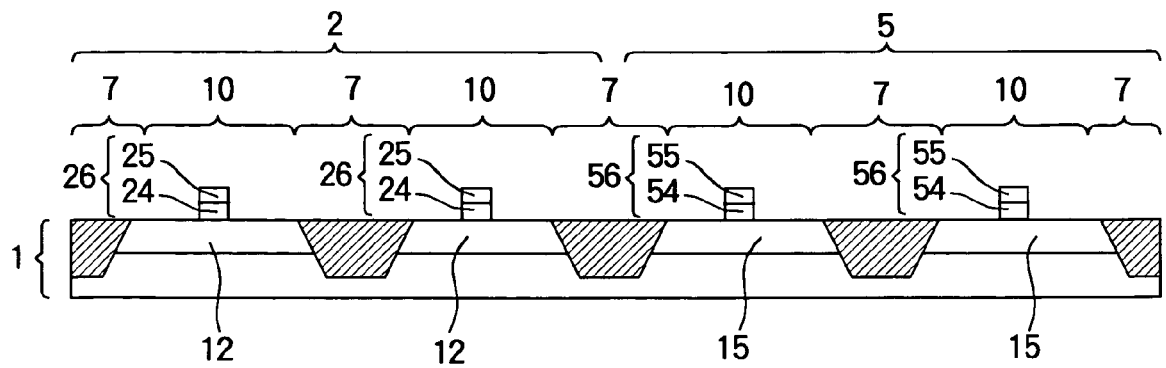

Next, as shown in FIG. 9, the gate electrodes 26, 56 are formed on the semiconductor substrate 1 in the memory cell area 2 and peripheral area 5. First, the surface of the semiconductor substrate 1 is oxidized by heating in an oxygen atmosphere at 850° C. to form a gate oxide film. Then, the polysilicon and tungsten silicide layers that constitute the gate electrodes are sequentially grown on the gate oxide film, and these layers and the gate oxide film are patterned by a photolithography process. First gate insulation films are thereby formed on the semiconductor substrate 1 in the memory cell area 2, and first gate electrodes 26 comprising multilayer films of polysilicon 24 and tungsten silicide 25 are formed on the first gate insulation films. Simultaneously, second gate insulation films are formed on the semiconductor substrate 1 in the peripheral area 5, and second gate electrodes 56 comprising multilayer films of polysilicon 54 and tungsten silicide 55 are formed on the second gate insulation films. At this stage, parts of the surface of the semiconductor substrate 1 not covered by the gate electrodes 26, 56, are exposed in the active areas 10.

Figure 10:
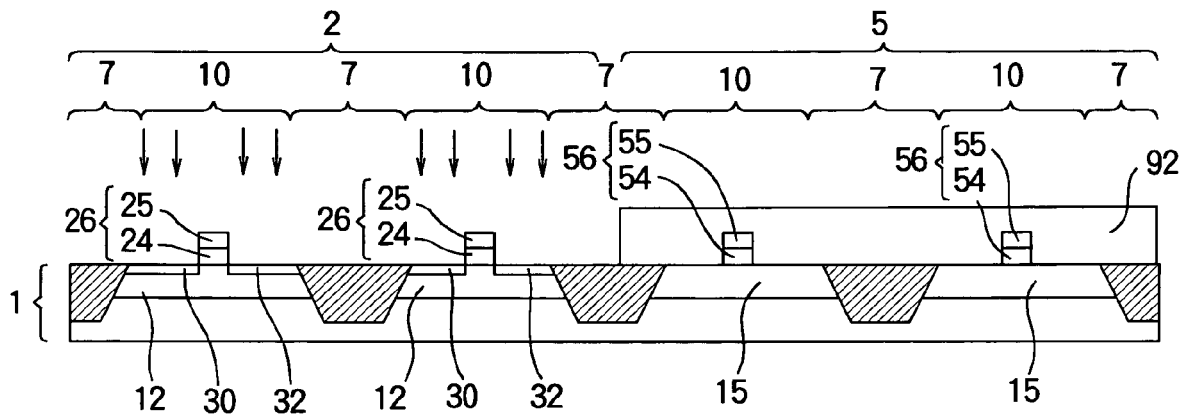

Next, as shown in FIG. 10, the variable resistance areas 30, 32 are formed in the active areas 10 in the memory cell area 2. A photoresist material is deposited and patterned to form a resist mask 92 covering the area exterior to the memory cell area 2, and, using the resist mask 92 and gate electrodes 26 as a mask, arsenic (As) ions, which are an n-type impurity, are implanted into the surface layer area of the semiconductor substrate 1. The ion implantation energy and dose are 30 keV and $2 \times 10^{12}$ cm$^{-2}$, respectively. This implantation reduces the net carrier concentration in a surface layer of the part of each active area 10 not covered by the gate electrode 26. After ion implantation, the resist mask 92 is removed. The preferred range of the arsenic implantation dose will be described later. Antimony (Sb) may be used instead of arsenic. Since antimony is heavier than arsenic, use of antimony can greatly reduce the doping concentration in the surface area of the semiconductor substrate 1, making it possible to obtain a steeper concentration profile, which leads to a larger difference in read current between the programmed and erased states.

Figure 11:
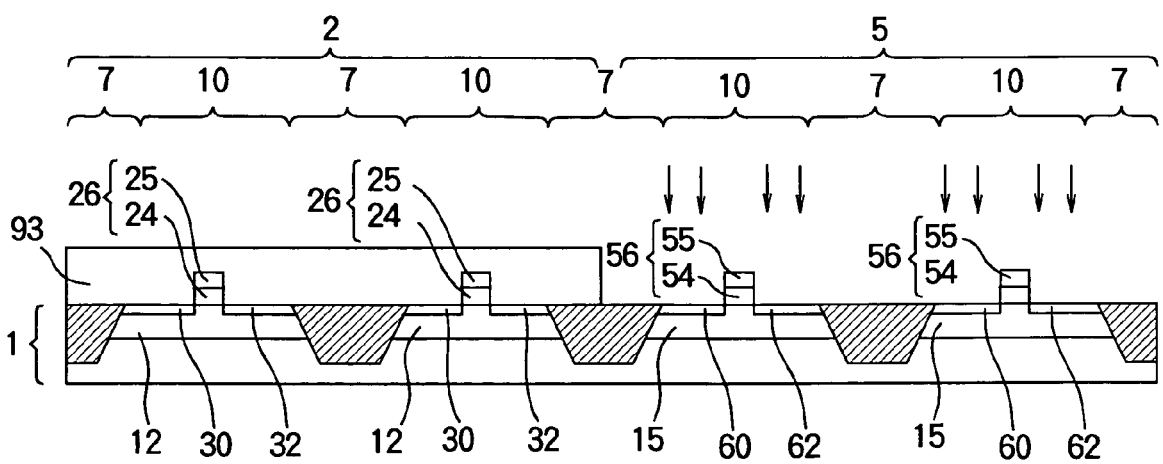

Next, as shown in FIG. 11, the LDD areas 60, 62 are formed in the active areas 10 in the peripheral area 5. A resist mask 93 is formed covering the area exterior to the peripheral area 5, and phosphorus (P) ions are implanted. The ion implantation energy and dose are 20 keV and $2 \times 10^{13}$ cm$^{-2}$, respectively. At this point, the LDD areas 60, 62 occupy the entire surface of each active area 10 in the peripheral area 5 except for the part covered by the gate electrodes 56. After ion implantation, the resist mask 93 is removed.

Figure 12:
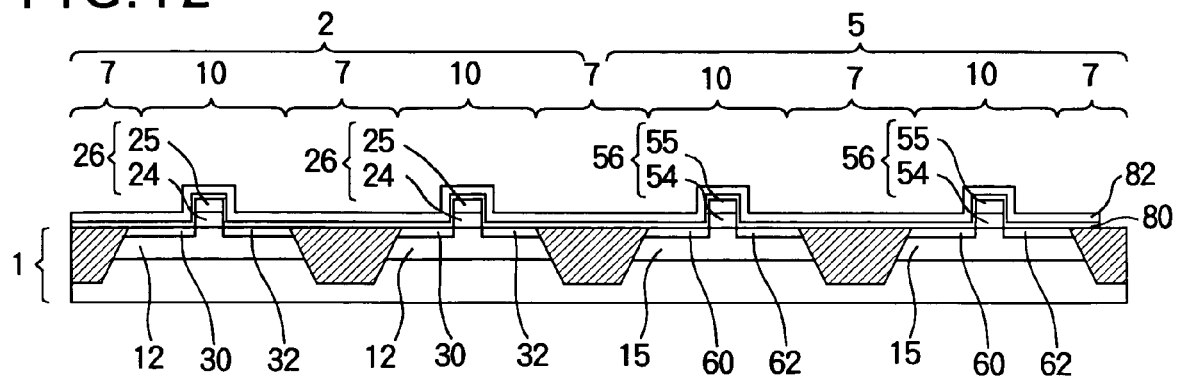

Next, as shown in FIG. 12, a charge storage layer 80 is formed covering both the memory cell area 2 and peripheral area 5. First, a silicon oxide film (first oxide film) is formed in both the memory cell area 2 and peripheral area 5, covering the semiconductor substrate 1 and the gate electrodes 26, 56. The semiconductor substrate 1 is then exposed to an oxygen atmosphere at 1000° C. to oxidize the surface of the isolation areas 7, parts of the surface of the semiconductor substrate 1 not covered by the gate electrodes 26, 56 in the active areas 10, and the top surfaces and sidewalls of the gate electrodes 26, 56, forming a silicon oxide layer (first oxide film) with a thickness of ten nanometers (10 nm). Then the charge storage nitride film or silicon nitride layer is formed on the silicon oxide layer by CVD. The thickness of this silicon nitride layer is also 10 nm. The multilayer film comprising the silicon oxide layer and charge storage nitride layer constitutes the charge storage layer 80. A sidewall oxide film 82 (of NSG) is then formed by CVD, covering both the memory cell area 2 and peripheral area 5 with a thickness of 40 nm.

Figure 13:
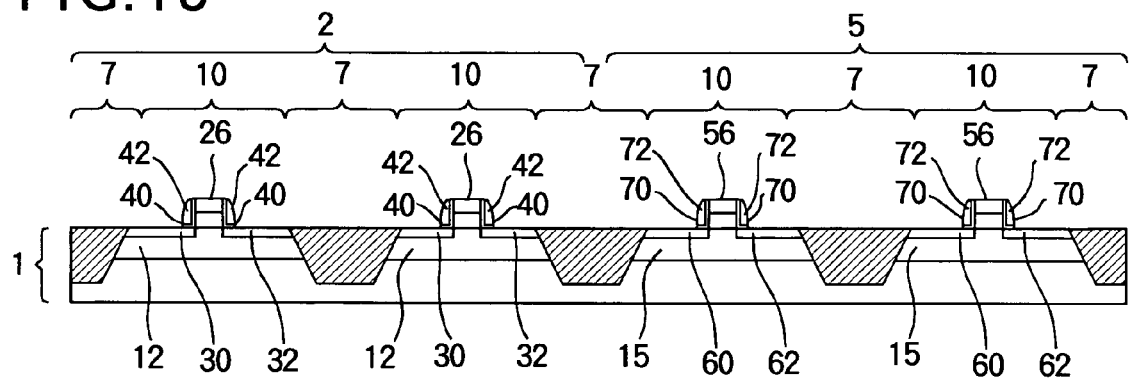

Next, as shown in FIG. 13, the first sidewalls 42, second sidewalls 72, charge storage bodies 40, and multilayer films 70 are formed in the memory cell area 2 and peripheral area 5. First, the sidewall oxide film 82 covering the memory cell area 2 and peripheral area 5 is anisotropically etched. A pair of first sidewalls 42 are thereby formed on the charge storage layer 80 on the two sides of each first gate electrode 26. Simultaneously, a pair of second sidewalls 72 are formed on the charge storage layer 80 on the two sides of each second gate electrode 56. Then, using the first sidewalls 42 and second sidewalls 72 as a mask, the charge storage layer 80 is etched. In the memory cell area 2, the charge storage layer 80 on the top of the first gate electrode 26 and parts of the charge storage layer 80 on the semiconductor substrate 1 not protected by the first gate electrodes 26 and first sidewalls 42 are removed by this etching process. In the peripheral area 5, the part of the charge storage layer 80 covering the tops of the second gate electrodes 56 and parts of the charge storage layer 80 on the semiconductor substrate 1 not protected by the second gate electrodes 56 and second sidewalls 72 are removed by the same etching process. The charge storage bodies 40 are thus formed in the memory cell area 2. Although multilayer films 70 having the same structure as the charge storage bodies 40 are also formed in the peripheral area 5, as noted above, these multilayer films 70 are not used for storing charge.

Figure 14:
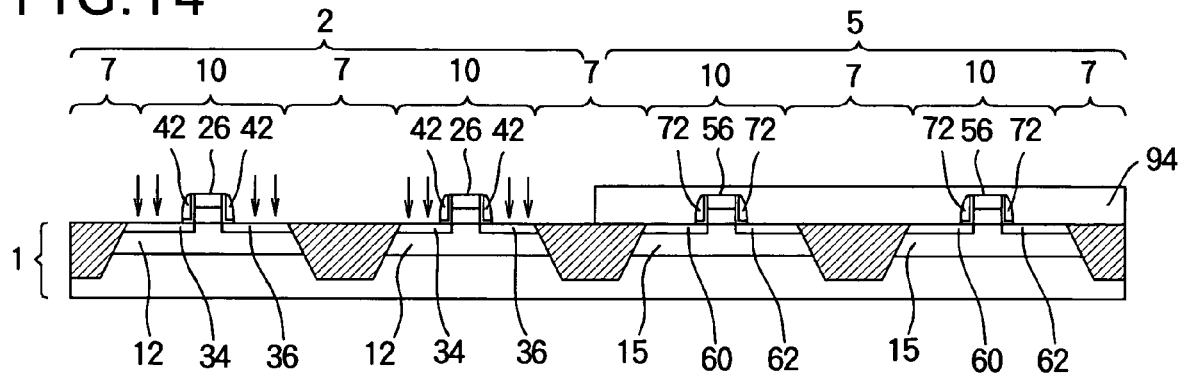

Next, as shown in FIG. 14, the source areas 34 and drain areas 36 (first highly doped areas) are formed in the active areas 10 in the memory cell area 2. A resist mask 94 is formed covering the area exterior to the memory cell area 2, and arsenic ions are implanted as an n-type impurity into areas not covered by the resist mask 94, the first gate electrodes 26, or the first sidewalls 42. The ion implantation energy and dose are 30 keV and $1.0 \times 10^{15}$ cm$^{-2}$, respectively. The source areas 34 and drain areas 36 (first highly doped areas) are thereby formed in a surface layer of the semiconductor substrate 1 in the part of each active area 10 in the memory area 2 not covered by the first gate electrodes 26 and first sidewalls 42. The areas below the gate electrodes 26 and the first sidewalls 42 are left as channel areas 28 and variable resistance areas 30, 32, as shown in FIG. 3. The variable resistance areas 30, 32 extend for a short distance beneath the edges of the gate electrodes 26, although this is not visible in the drawings. After ion implantation, the resist mask 94 is removed.

Figure 15:
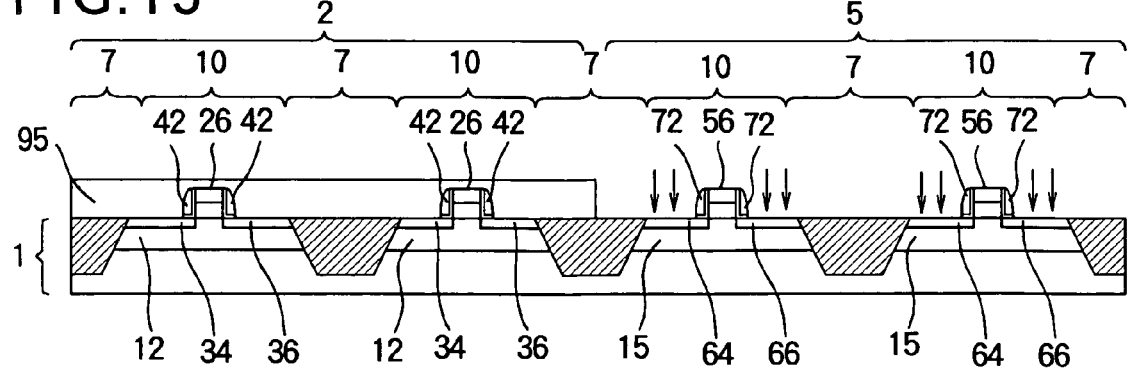

Next, as shown in FIG. 15, the source areas 64 and drain areas 66 (second highly doped areas) are formed in the active areas 10 in the peripheral area 5. A resist mask 95 is formed covering the area exterior to the peripheral area 5, and, using the resist mask 95, second gate electrodes 56, and second sidewalls 72 as a mask, arsenic is implanted as an n-type impurity. The ion implantation energy and dose are 30 keV and $1.0 \times 10^{15}$ cm$^{-2}$, respectively. The source areas 64 and drain areas 66 (second highly doped areas) are thereby formed in the surface layer area of the semiconductor substrate 1, in the part of each active area 10 in the peripheral area 5 not covered by the second gate electrodes 56 and second sidewalls 72. The areas below the gate electrodes 56 and the first sidewalls 72 are left as channel areas 58 and LDD areas 60, 62, as shown in FIG. 5. After the ion implantation, the resist mask 95 is removed.

This completes the fabrication of a nonvolatile semiconductor memory 100 including memory cells 20 according to the embodiment shown in FIGS. 2 and 3.

Experiments and Simulations on Varying Resistance Areas

The structure and fabrication method of the variable resistance areas 30, 32 of the memory cell 20 in the embodiment are based on the results of considerable research conducted by the present inventors.

The inventors focused their attention on the relationship between the structure and fabrication method of the variable resistance areas 30, 32 and the change in read current caused by writing information in the memory cell. Various write characteristics were investigated through experiments and simulations, the results of which are shown in the FIGS. 16-21.

Figure 16:
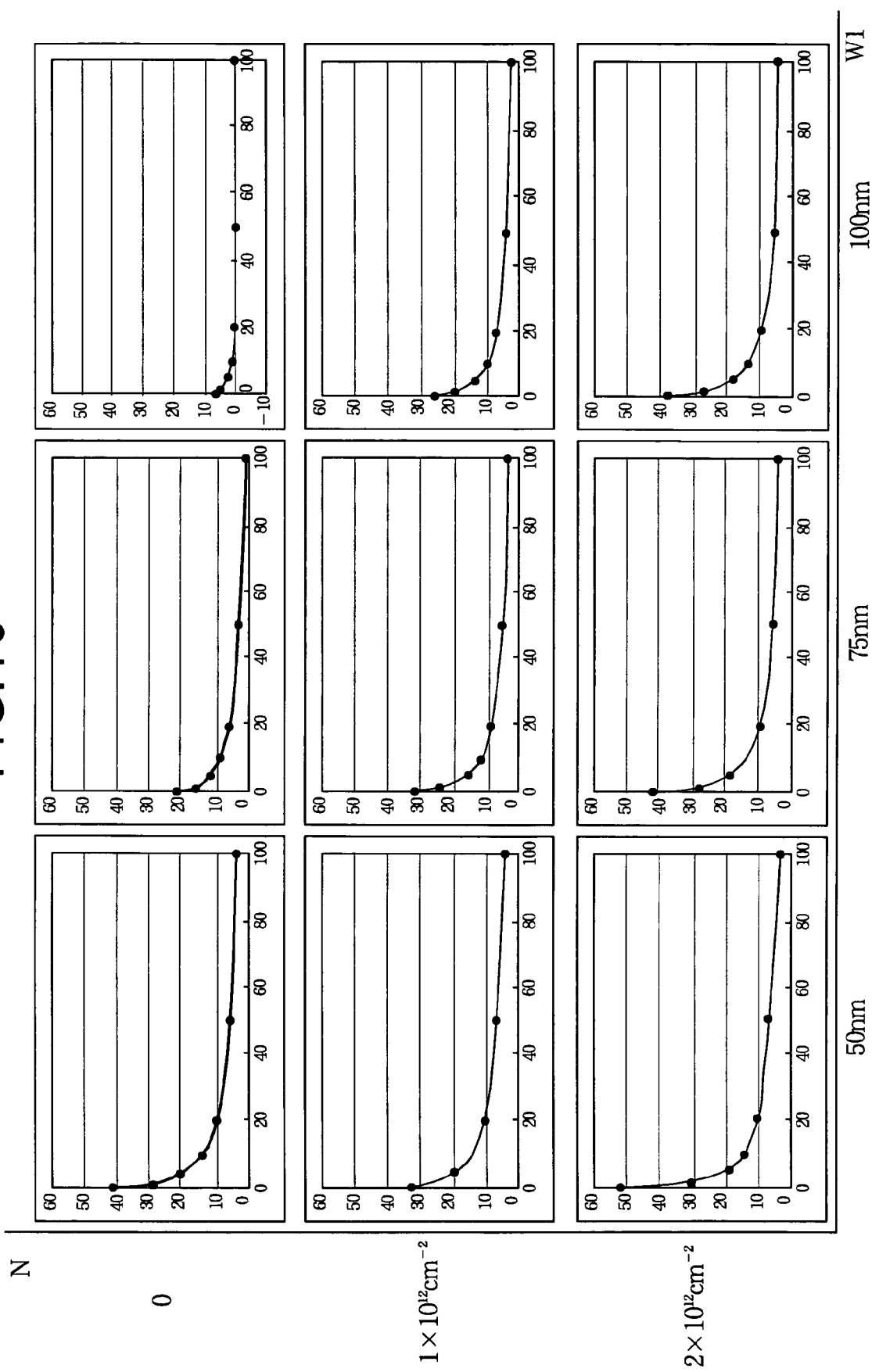
FIG. 16 is a set of graphs illustrating write characteristics of the memory cell in the first embodiment for different values of the sidewall width W1 and arsenic implantation dose N.

In FIG. 16, a set of graphs illustrates write characteristics of the memory cell 20 in the embodiment when the sidewall width W1 indicated on the outer horizontal axis has values of 50 nm, 75 nm, and 100 nm, and the arsenic concentration (ion implantation dose: N) indicated on the outer vertical axis is 0 (zero), $1 \times 10^{12}$ cm$^{-2}$, and $2 \times 10^{12}$ cm$^{-2}$. That is, there are three conditions on the sidewall width and three conditions on the arsenic implantation dose N for each of the sidewall width conditions, resulting in nine conditions in total. Writing (programming) was performed at a gate voltage of 8 V and a drain voltage of 5.5 V, and reading was performed at a gate voltage of 2.5 V and a source voltage of 2 V. That is, information was written and read in the drain-side storage area. In each of the nine inner graphs, the horizontal axis indicates write time in microseconds (µs) and the vertical axis indicates the read current in microamperes (µA) obtained after writing for the time-period indicated on the horizontal axis. The experiment performed under the conditions of a sidewall width of 50 nm and an arsenic implantation dose N of 0 (zero), for example, gave an initial read current of about 40 µA in the erased state before any writing was performed, that is, when the write time was 0 (zero); the read current after writing for 20 µs was about 10 µA; and the read current after writing for 100 µs was about 4 µA.

In the data in FIG. 16, first paying attention to the sidewall width W1, one observes a tendency of the initial current to increase when W1 is comparatively narrow (50 nm) because the variable resistance area 32 has a smaller resistance value, whereas when W1 is comparatively wide (100 nm), the initial current becomes smaller because the variable resistance area 32 has a larger resistance value.

Next, looking at the arsenic implantation dose N, one observes a tendency for the initial current to be comparatively small when the N is zero, and to increase as N increases up to $2 \times 10^{12}$ cm$^{-2}$.

When the initial current is large, writing for even a comparatively short time reduces the cell current by a considerable amount, producing a good write characteristic with a large difference in read current before and after the write operation. In contrast, when the initial current is small, the write characteristic is poor: even after writing for a considerable time, the difference in read current before and after the write operation remains small.

When the arsenic implantation dose N is zero, if the sidewall width W1 is as wide as 100 nm, the initial current is very small (less than 10 µA). If the process variation of the sidewall width W1 is considered, the conclusion is that an arsenic implantation dose of zero (N=0) is not suitable for practical use. In contrast, when N is $1 \times 10^{12}$ cm$^{-2}$ or $2 \times 10^{12}$ cm$^{-2}$, even if W1 becomes as wide as 100 nm, the initial current is still large enough to produce a clearly recognizable difference before and after writing, so if the process variation of the W1 dimension can be held to, for example, less than about 10 nm, a sufficient current difference can be ensured and therefore these dose conditions are suitable for practical use.

Figure 17:
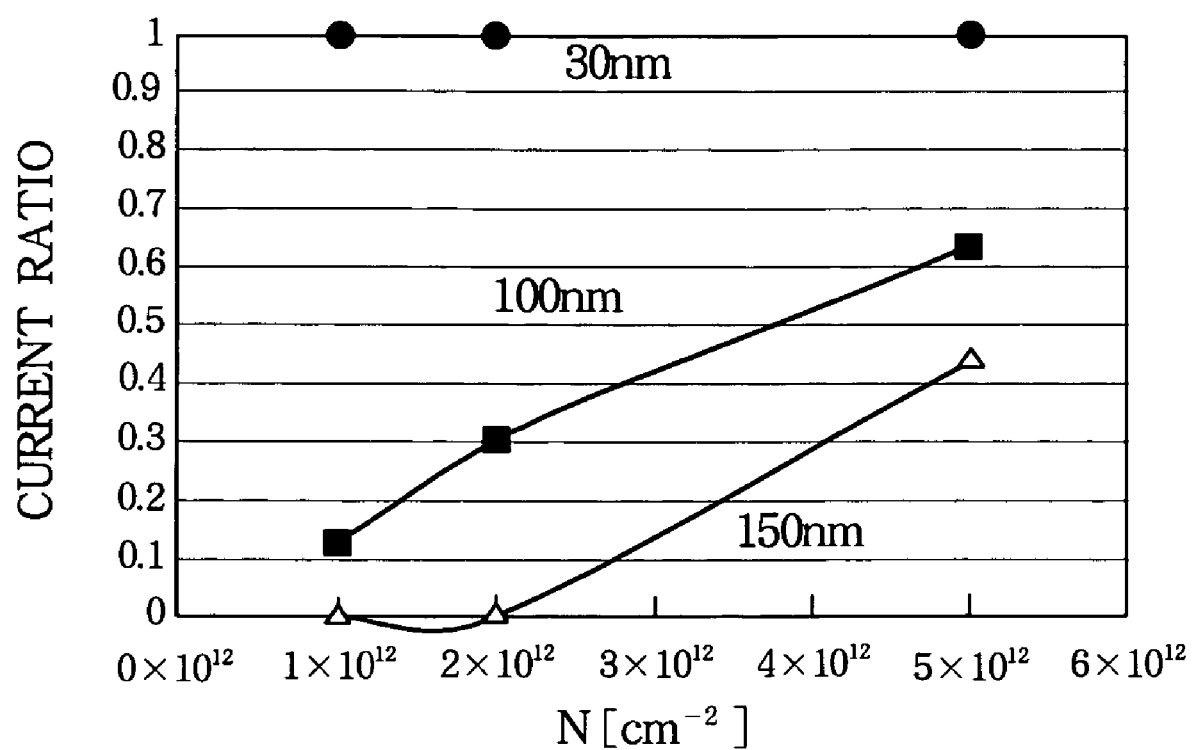
FIG. 17 is a graph illustrating the relationship between the current change ratio and the arsenic implantation dose N in the memory cell in the first embodiment.

The graph in FIG. 17 shows device simulation results for these two arsenic implantation doses (N) and a higher dose. The vertical axis indicates the read current change ratio obtained when a negative charge concentration or electron concentration of $5 \times 10^{-18}$ cm$^{-2}$ is placed in the charge storage layer as written information. The three sets of data are for sidewall widths W1 of 30 nm (diamond marks), 100 nm (square marks), and 150 nm (triangular marks). When the sidewall width is 100 nm and the arsenic implantation dose N is $2 \times 10^{12}$ cm$^{-2}$, for example, the ratio of the read current after writing to the read current before writing is about 0.3, implying that the write operation has reduced the read current by a factor of more than three.

From this simulation, one observes a general tendency for the current change associated with writing operations to increase as the arsenic implantation dose N is reduced (for example, to $1 \times 10^{12}$ cm$^{-2}$), and to decrease as N increases. When N is increased to $5 \times 10^{12}$ cm$^{-2}$, for example, even with 150-nm sidewalls, the write operation changes the read current by only a factor of slightly more than two, which may still be adequate for practical use but does not allow much operating margin. The reason why the current change ratio becomes smaller as N increases is that, as the n-type doping concentration in the variable resistance areas 30, 32 is increased, it masks the effect of injecting an n-type charge into the charge storage body 40, so that the stored charge changes the resistance of the variable resistance areas 30, 32 by a comparatively small amount.

Figure 18:
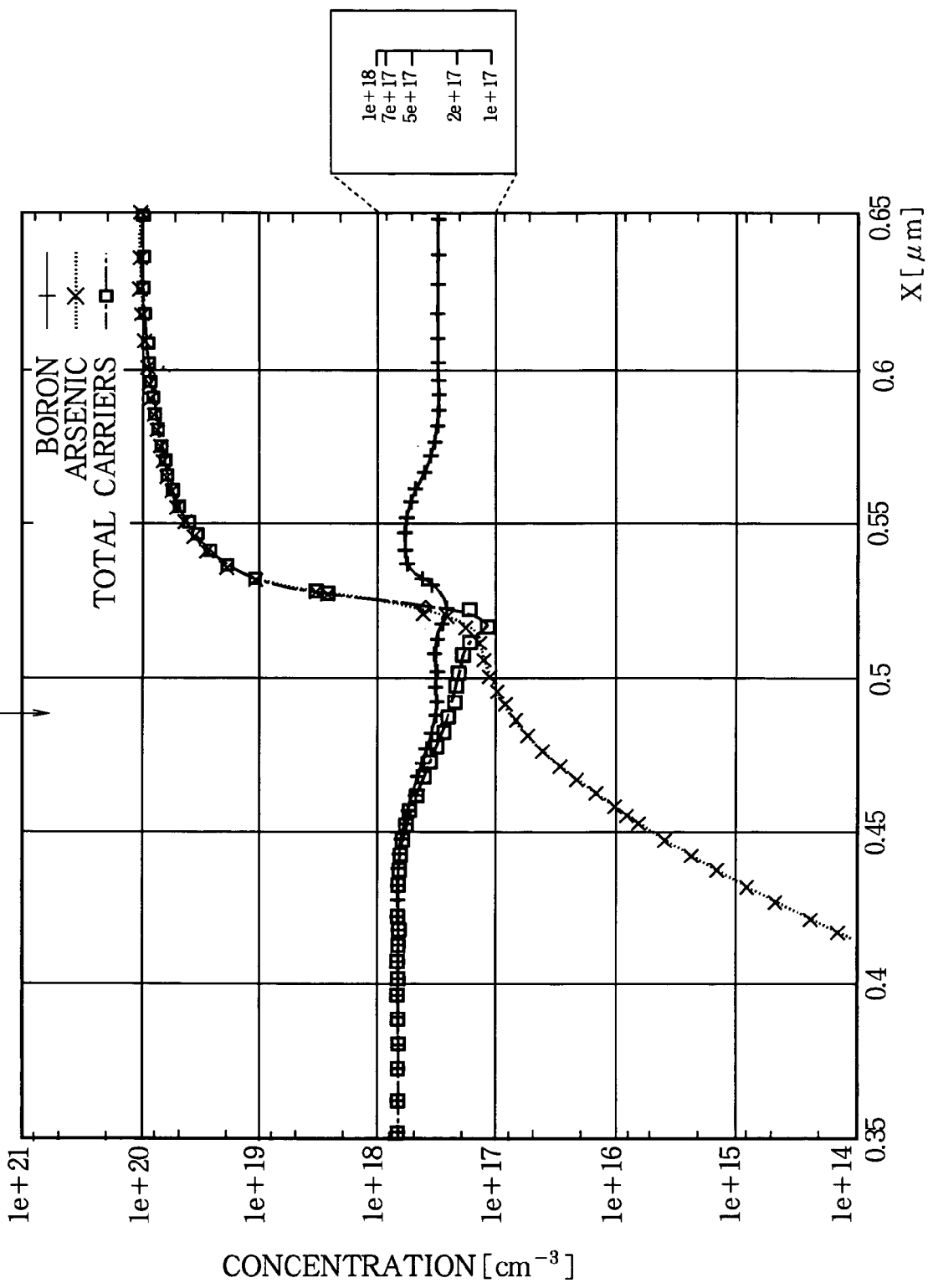
FIG. 18 is a graph illustrating lateral profiles of impurity and carrier concentrations in the memory cell in the first embodiment for an arsenic implantation dose N of $1\times10^{12}$ cm$^{-2}$.
Figure 19:
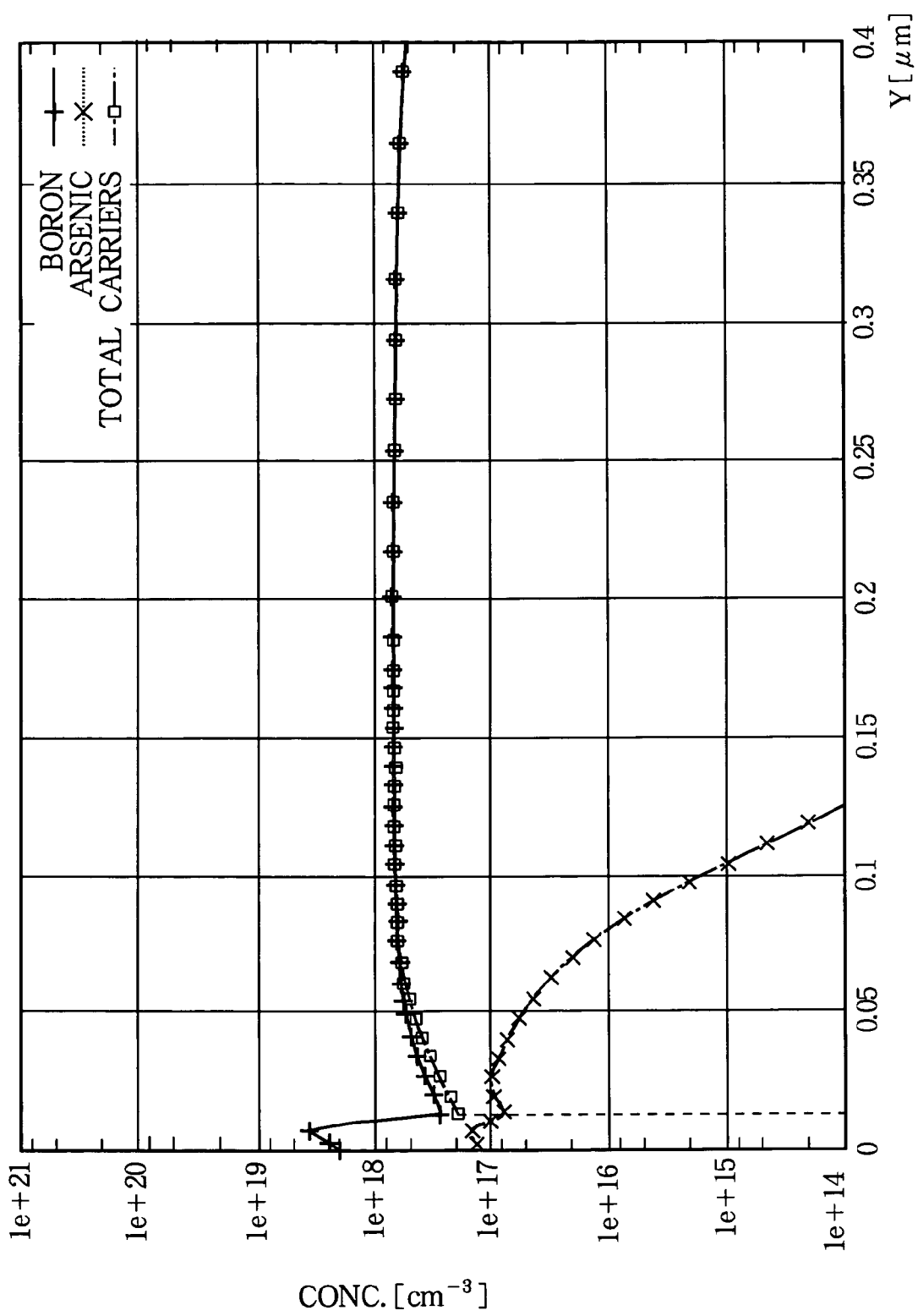
FIG. 19 is a graph illustrating depth profiles of impurity and carrier concentrations in the memory cell in the first embodiment for an arsenic implantation dose N of $1\times10^{12}$ cm$^{-2}$.
Figure 20:
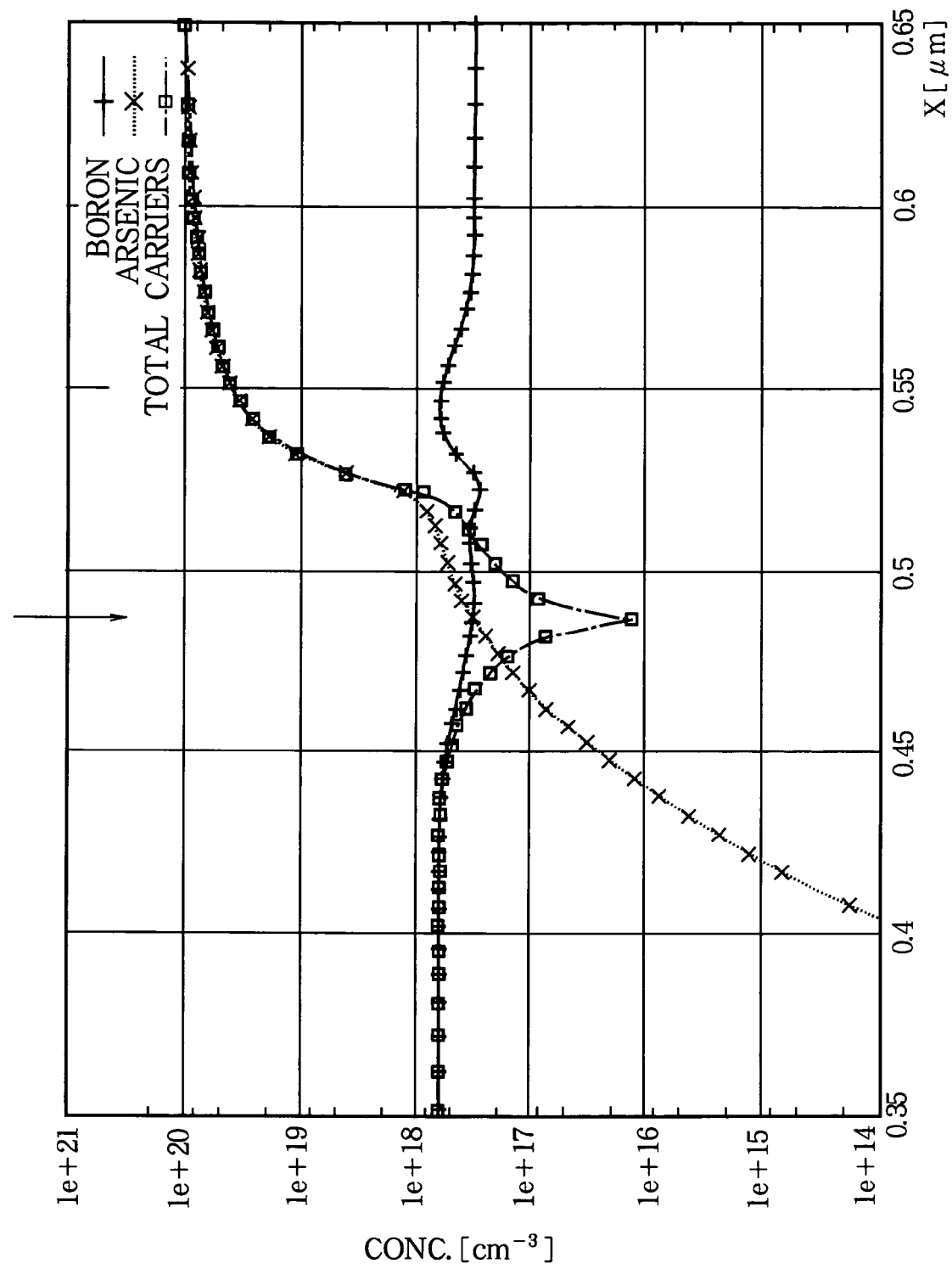
FIG. 20 is a graph illustrating lateral profiles of impurity and carrier concentrations in the memory cell in the first embodiment for an arsenic implantation dose N of $5\times10^{12}$ cm$^{-2}$.
Figure 21:
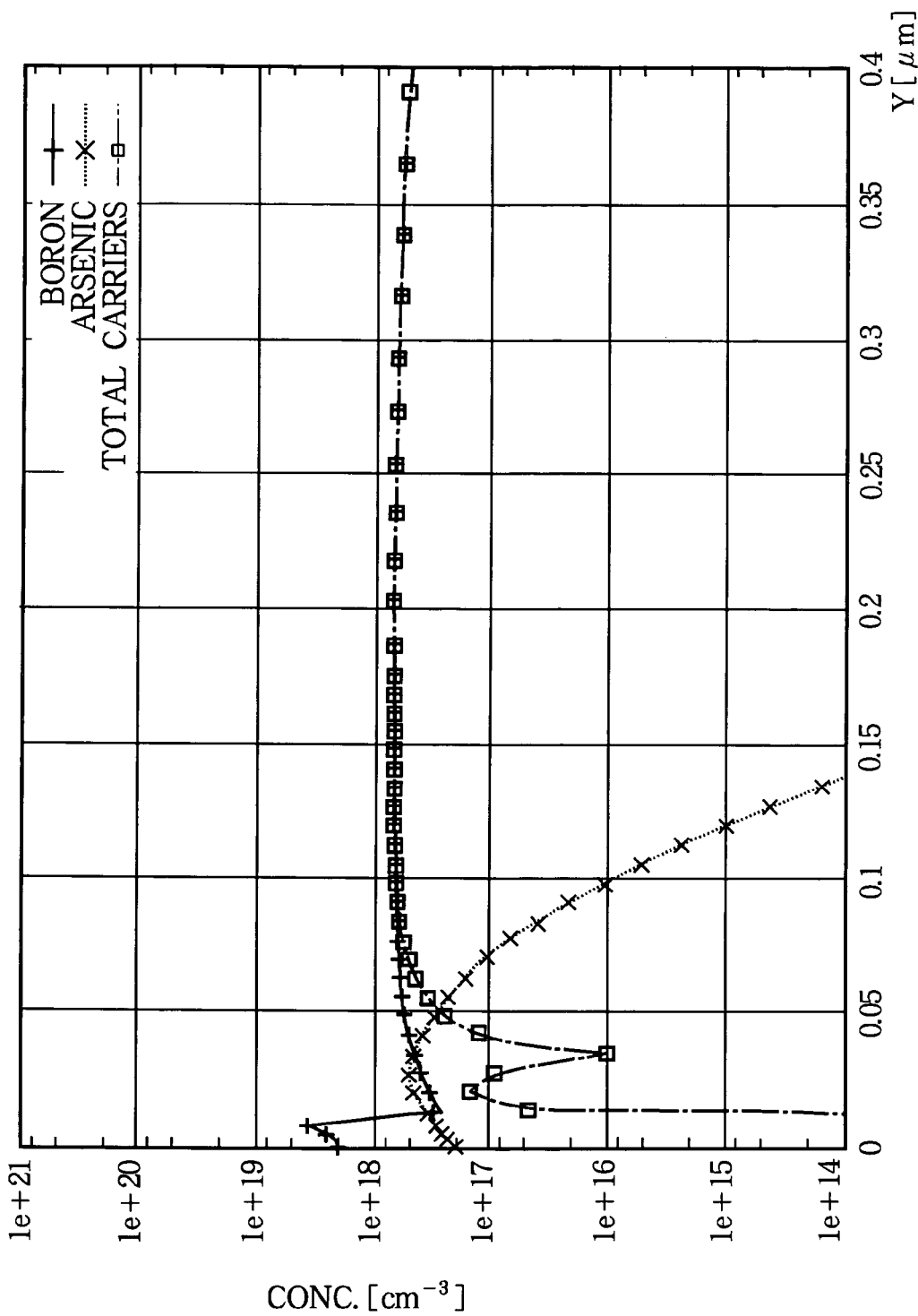
FIG. 21 is a graph illustrating depth profiles of impurity and carrier concentrations in the memory cell in the first embodiment for an arsenic implantation dose N of $5\times10^{12}$ cm$^{-2}$.

The graphs in FIGS. 18 and 19 illustrate impurity and carrier concentration profiles of the memory cell 20 obtained by a two-dimensional process simulator with the arsenic implantation dose N for forming the variable resistance areas 30, 32 set to $1 \times 10^{12}$ cm$^{-2}$. The graphs in FIGS. 20 and 21 illustrate impurity and carrier concentration profiles of the memory cell 20 obtained by the two-dimensional process simulator with the arsenic implantation dose N for forming the variable resistance areas 30, 32 set to $5 \times 10^{12}$ cm$^{-2}$. In each of the graphs, the impurity concentrations of boron and arsenic and the net total carrier concentration at the dimension (X or Y) indicated on the horizontal axis are shown on a logarithmic scale on the vertical axis. X is a horizontal dimension that increases toward the right in FIG. 3; Y is a depth dimension.

In FIG. 18, for example, the boron and arsenic concentrations at the position X=0.5 μm, just beyond the edge of the gate electrode, are about $4 \times 10^{17}$ cm$^{-3}$ and $1 \times 10^{17}$ cm$^{-3}$, respectively. Since the concentration of the p-type impurity (boron) is greater than that of the n-type impurity (arsenic), the resulting conductivity is p-type with a net total carrier concentration of about $3 \times 10^{17}$ cm$^{-3}$. As another example, in FIG. 20, the boron and arsenic concentrations at the position X=0.5 μm are about $4 \times 10^{17}$ cm$^{-3}$ and $5 \times 10^{17}$ cm$^{-3}$, respectively. Since the concentration of the n-type impurity (arsenic) is greater than the concentration of the p-type impurity (boron), the resulting conductivity is n-type with a net total carrier concentration of about $2 \times 10^{17}$ cm$^{-3}$.

In FIGS. 18 and 20, which illustrate lateral impurity and carrier concentration profiles in the surface layer area of the semiconductor substrate 1 in the X-direction of the memory cell (toward the right in FIG. 3), the gate electrode 26 occupies the area where X≦0.49 μm. In both FIGS. 18 and 20, the total carrier concentration exhibits a gradual decrease from the point where X=0.46 μm toward the edge of the gate, which indicates that the variable resistance area 32 is disposed in the area where X≧0.46 μm. Also in both FIGS. 18 and 20, the arsenic concentration increases steeply in the area in which 0.52 μm≦X≦0.53 μm, indicating the start of the drain area 36. Accordingly, in both FIGS. 18 and 20, the area in which 0.46 μm≦X≦0.52 μm corresponds to the variable resistance area 32.

FIGS. 19 and 21 show impurity and carrier concentration profiles at the position X=0.5 μm in FIGS. 18 and 20. These profiles are depth profiles (in the Y-direction) at one position in the variable resistance area 32. In both FIGS. 19 and 21, the silicon oxide film 38 is disposed in the area where 0 μm≦Y≦0.01 μm and the variable resistance area 32 begins at Y=0.01 μm. In FIG. 19, the total carrier concentration exhibits a gradual decrease from the depth Y=0.05 μm toward the surface of the substrate (toward the left in the drawing), indicating that the variable resistance area 32 extends to a depth of Y=0.05 μm. In FIG. 21, the total carrier concentration exhibits a gradual decrease from the depth Y=0.07 μm toward the surface of the substrate (toward the left), indicating that the variable resistance area 32 extends to a depth of Y=0.07 μm. Accordingly, the variable resistance area 32 occupies the depth range 0.01 μm≦Y≦0.05 μm in FIG. 19 and the depth range 0.01 μm≦Y≦0.07 μm in FIG. 21.

These profiles indicate that when a relatively small amount of the arsenic, i.e. N=$1 \times 10^{12}$ cm$^{-2}$, is implanted into the variable resistance area 32 (as in FIGS. 18 and 19), although the carrier concentration in the variable resistance area 32 is reduced by the arsenic implantation, the conductivity type of the entire variable resistance area 32 is not changed to n-type but remains p-type because the boron concentration is still higher than the arsenic concentration in this area. The maximum carrier concentration in the variable resistance area 32 can be read from FIG. 18 as $5 \times 10^{17}$ cm$^{-3}$ (at X=0.46), and can also be read from FIG. 19 as $5 \times 10^{17}$ cm$^{-3}$ (at Y=0.05). Accordingly, it can be seen that when the arsenic implantation dose N is $1 \times 10^{12}$ cm$^{-2}$, conduction in the entire variable resistance area 32 is p-type and the carrier concentration in the area is at most $5 \times 10^{17}$ cm$^{-3}$.

When a significantly larger amount of the arsenic, i.e. N=$5 \times 10^{12}$ cm$^{-2}$, is implanted into the variable resistance area 32 (as in FIGS. 20 and 21), the variable resistance area 32 includes both p-type and n-type areas; that is, part of the variable resistance area 32 becomes n-type. Specifically, within the lateral range 0.46 μm≦X≦0.52 μm of the variable resistance area 32, conduction in the area where 0.46 μm≦X≦0.49 μm is p-type because the boron concentration is higher than the arsenic concentration, whereas conduction in the area where 0.49 μm≦X≦0.52 μm is n-type because the arsenic concentration is higher than the boron concentration. Similarly, in FIG. 21, within the depth range 0.01 μm≦Y≦0.07 μm of the variable resistance area 32, conduction at depths Y of 0.01 μm≦Y≦0.03 μm is n-type because the arsenic concentration is higher than the boron concentration, whereas conduction at depths Y of 0.03 μm≦Y≦0.07 μm is p-type because the boron concentration is higher than the arsenic concentration. The maximum carrier concentrations can be read from FIG. 20 as $5 \times 10^{17}$ cm$^{-3}$ for both the p-type and n-type. The maximum carrier concentrations read from FIG. 21 are $5 \times 10^{17}$ cm$^{-3}$ for the p-type area and $1.5 \times 10^{17}$ cm$^{-3}$ for the n-type area. Accordingly, it can be seen that when the arsenic implantation dose N is $5 \times 10^{12}$ cm$^{-2}$, the variable resistance area 32 includes both p-type and n-type conduction areas (that is, part of the variable resistance area 32 is n-type), and the carrier concentrations in both the p-type and n-type areas are within $5 \times 10^{17}$ cm$^{-3}$.

Based on the experimental results and simulations shown in FIG. 16 to 21, the preferred range of the arsenic implantation dose N and the preferred conductive type and carrier concentration range of the variable resistance area 32 are as follows.

First, the preferred range of the arsenic implantation dose N will be considered. An arsenic implantation dose N of zero is unsuitable for practical use as noted in the discussion of the results of the experiments in FIG. 16. On the other hand, an arsenic implantation dose N as large as $5 \times 10^{12}$ cm$^{-2}$ causes the current change ratio to decrease as described in FIG. 17; doses higher this value would be unsuitable for practical use. The practical range of the arsenic implantation dose N is accordingly from $1 \times 10^{12}$ cm$^{-2}$ to at most $5 \times 10^{12}$ cm$^{-2}$.

Next, according to the profiles shown in FIGS. 18 and 19, the arsenic and boron concentrations at X=0.52, where the smallest difference between the concentrations occurs, are $1.5 \times 10^{17}$ cm$^{-3}$ and $3.5 \times 10^{17}$ cm$^{-3}$, respectively. From the ratio of these concentrations, if the arsenic implantation dose N is increased by a factor of 2.3 (=3.5÷1.5), the arsenic and boron concentrations will become equal. Since the arsenic implantation dose N in FIGS. 18 and 19 is $1 \times 10^{12}$ cm$^{-2}$, it can be inferred that if the arsenic implantation dose N is larger than $2.3 \times 10^{12}$ cm$^{-2}$, conduction in the variable resistance area 32 will change from purely p-type to a combination of p-type and n-type. Conversely, it can be inferred that when the arsenic implantation dose N is less than $2.3 \times 10^{12}$ cm$^{-2}$, conduction in the variable resistance area 32 will remain purely p-type. Since a smaller arsenic implantation dose N produces a larger current change ratio according to the simulation results in FIG. 17, it follows that a larger current change ratio can be obtained when the variable resistance area 32 is a purely p-type semiconductor area than when the conduction mechanism in the variable resistance area 32 includes n-type conduction. Therefore, an arsenic implantation dose N of at least $1 \times 10^{12}$ cm$^{-2}$ and at most $2.3 \times 10^{12}$ cm$^{-2}$ is preferable because it makes the entire variable resistance area 32 p-type and produces a larger current change ratio.

Next, the conductive type and carrier concentration in the variable resistance area 32 corresponding to the above-described preferred range of the arsenic implantation dose N will be considered. First, when the arsenic implantation dose N is $1 \times 10$ cm$^{12}$ cm$^{-2}$, from FIGS. 18 and 19, conduction in the entire variable resistance area 32 is p-type and the carrier concentration in this area is at most $5 \times 10^{17}$ cm$^{-3}$. When the arsenic implantation dose N is $5 \times 10^{12}$ cm$^{-2}$, from FIGS. 20 and 21, the variable resistance area 32 includes both p-type and n-type conductive areas and the carrier concentration in both the p-type and n-type areas is at most $5 \times 10^{17}$ cm$^{-3}$. Therefore, when the arsenic implantation dose N is in the range of $1 \times 10^{12}$ cm$^{-2}$ to $5 \times 10^{12}$ cm$^{-2}$, the carrier concentration in the variable resistance area 32 is at most $5 \times 10^{17}$ cm$^{-3}$ regardless of whether the conductivity is p-type or n-type.

As described above, whether conduction in the variable resistance area 32 is p-type or n-type, the carrier concentration that may be considered suitable for practical use is at most $5 \times 10^{17}$ cm$^{-3}$.

Also as described above, it is preferable that the variable resistance area 32 be made entirely a p-type area rather than partly an n-type area, because a larger current change ratio can be obtained. Therefore, the entire variable resistance area 32 is preferably a p-type semiconductor area and the carrier concentration in this area is preferably at most $5 \times 10^{17}$ cm$^{-3}$, because this produces a larger current change ratio.

Comparison between Varying Resistance Areas and LDD Areas

The structure and fabrication method of the variable resistance areas 30, 32 of the memory cells 20 in the memory cell area 2 have been described above. If their characteristics are summarized in comparison with the LDD areas 60, 62 of the peripheral transistor 50 in the peripheral area 5, the variable resistance areas 30, 32 are preferably characterized as follows.

First, the carrier concentration in the variable resistance areas 30, 32 of the memory cell 20 in the memory cell area 2 is preferably lower than the carrier concentration in the LDD areas 60, 62 in the peripheral area 5. This is because, as described above, the preferred carrier concentration in the variable resistance areas 30, 32 in the memory cell area 2 is at most $5 \times 10^{17}$ cm$^{-3}$ for either p-type or n-type conduction whereas the preferred carrier concentration in the LDD areas 60, 62 is in the range from $1 \times 10^{18}$ cm$^{-3}$ to $1 \times 10^{19}$ cm$^{-3}$.

The variable resistance areas 30, 32 in the memory cell area 2 are also preferably shallower than the LDD areas 60, 62 in the peripheral area 5. The depths of the variable resistance areas 30, 32 and LDD areas 60, 62 are determined by the type of ion (dopant) implanted, the ion implantation energy, and the ion implantation dose. As described above, when the variable resistance areas 30, 32 are formed by ion implantation of arsenic, an implantation dose N of at least $1 \times 10^{12}$ cm$^{-2}$ and at most $5 \times 10^{12}$ cm$^{-2}$ and an energy of 30 keV is preferable. On the other hand, the LDD areas 60, 62 in the peripheral area 5 are formed by ion implantation of phosphorus at a dose of $2.0 \times 10^{13}$ cm$^{-2}$ and an energy of 20 keV. When the variable resistance areas 30, 32 and LDD areas 60, 62 are formed under these conditions, the depth of the variable resistance areas 30, 32 in the memory cell area 2 becomes shallower than the depth of the LDD areas 60, 62 in the peripheral area 5. Accordingly, the variable resistance areas 30, 32 in the memory cell area 2 are preferably shallower than the LDD areas 60, 62 in the peripheral area 5.

The variable resistance areas 30, 32 in the memory cell area 2 are also preferably doped with an impurity of heavier atomic weight than the impurity with which the LDD areas 60, 62 in the peripheral area 5 are doped. This is because, as described above, the variable resistance areas 30, 32 in the memory cell area 2 are preferably doped by ion implantation of arsenic or antimony whereas the LDD areas 60, 62 in the peripheral area 5 are preferably doped by ion implantation of phosphorus.

The variable resistance areas 30, 32 in the memory cell area 2 are preferably formed with an ion implantation dose smaller than the ion implantation dose with which the LDD areas 60, 62 in the peripheral area 5 are formed. That is, as described above, the variable resistance areas 30, 32 in the memory cell area 2 are preferably formed at an ion implantation dose of at least $1 \times 10^{12}$ cm$^{-2}$ and at most $5 \times 10^{12}$ cm$^{-2}$ whereas the LDD areas 60, 62 in the peripheral area 5 are preferably formed at an ion implantation dose of $2 \times 10^{13}$ cm$^{-2}$.

Second Embodiment

Figure 22:
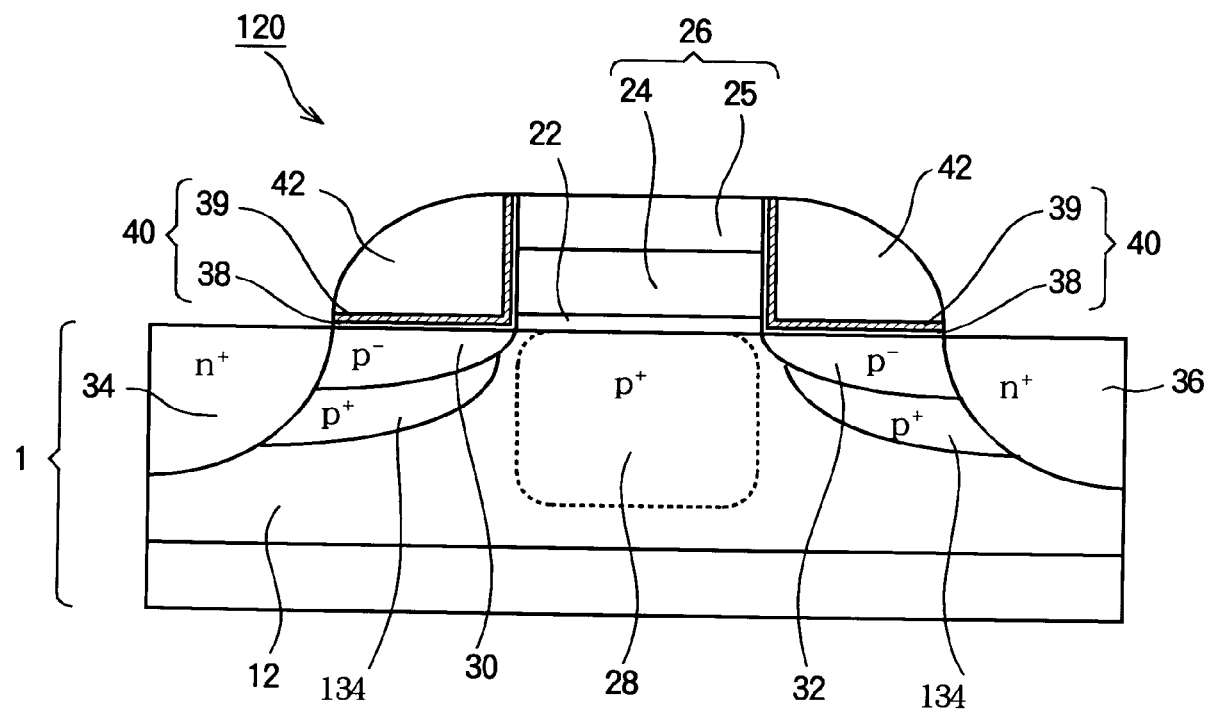
FIG. 22 shows a sectional view of the structure of a nonvolatile semiconductor memory cell according to a second embodiment of the invention.

Referring to FIG. 22, a second embodiment of the invention is a memory cell 120 that differs from the memory cell 20 of the first embodiment in that a pocket layer 134 doped with a p-type impurity at a slightly higher concentration than the channel area 28 is provided below the variable resistance areas 30, 32. The second embodiment also provides a nonvolatile semiconductor memory including memory cells as shown in FIG. 22.

Memory Cell Structure

Aside from the above difference, the memory structure and memory cell structure in the second embodiment are the same as in the first embodiment shown in FIGS. 2 and 3, so a detailed description will be omitted.

In a write operation, the pocket layer 134 provided below the variable resistance areas 30, 32 intensifies the electric field in the vicinity of the drain area 36 (or the source area 34 when writing is performed on the source side) thereby increasing the write speed.

Fabrication Method

Next, a method of fabricating the nonvolatile semiconductor memory according to the second embodiment will be described.

The fabrication process described below is similar to the fabrication process in the first embodiment (FIGS. 6 to 15), but a step for forming the pocket layer 134 is added after the step that forms the variable resistance areas 30, 32 in the active areas 10 in the memory cell area 2 (FIG. 10). The other process steps are carried out as described in the first embodiment; repeated descriptions will be omitted.

To form the pocket layer 134, after an n-type impurity is implanted into the active areas 10 in the memory cell area 2 as shown in FIG. 10, without removing the resist mask 92 but using it as a mask together with the gate electrodes 26, ions of the p-type impurity boron are implanted. This ion implantation step is performed at a dose of $1 \times 10^{13}$ cm$^{-2}$ and an energy of 40 keV. When boron ions are implanted at an energy of 40 keV, they penetrate into the semiconductor substrate 1 by a distance from the surface of about 0.12 μm, so it is possible to form the pocket layer 134 without greatly affecting the variable resistance areas 30, 32. The resist mask 92 is then removed and the step for forming the LDD areas 60, 62 in the active areas 10 in the peripheral area 5 is performed (FIG. 11). This step and the subsequent process steps through FIG. 15 are the same as in the fabrication of the nonvolatile semiconductor memory 100 in the first embodiment.

Instead of boron, another p-type impurity such as indium (In) may be implanted to form the pocket layer 134. Since indium has an atomic weight about ten times greater than the atomic weight of boron, it can form a pocket layer 134 with a higher impurity concentration. Indium can therefore create a steeper concentration profile, leading to a larger difference in read current before and after information is written.

Those skilled in the art will recognize that further variations are possible within the scope of the invention, which is defined in the appended claims.

What is claimed is:

1. A memory cell, comprising:
a semiconductor substrate having a doped surface layer;
a gate insulation film formed on the doped surface layer of the semiconductor substrate;
a gate electrode formed on the gate insulation film;
a channel area disposed in the doped surface layer of the semiconductor substrate below the gate electrode;
a pair of variable resistance areas formed on mutually opposite sides of the channel area in the doped surface layer, doped at a lower concentration than that of the channel area, the doping concentration in the variable resistance areas being at most five hundred quadrillion carriers per cubic centimeter ($5 \times 10^{17}$ cm$^{-3}$);
a pair of highly doped areas disposed on mutually opposite sides of the pair of variable resistance areas, and having a conductive type which is opposite to that of the channel area; and
a pair of charge storage bodies disposed above the pair of variable resistance areas on mutually opposite sides of the gate electrode for storing charge,
wherein the pair of variable resistance areas is doped with both p-type and n-type impurities, the n-type impurity having a concentration which is higher than that of the p-type impurity throughout the pair of variable resistance areas.

2. The memory cell of claim 1, wherein the pair variable resistance areas have a conductive type which is the same as that of the channel area.

3. The memory cell of claim 1, wherein the pair of variable resistance areas is doped with arsenic.

4. The memory cell of claim 1, wherein the pair of variable resistance areas is doped with antimony.

5. A memory cell, comprising:
a semiconductor substrate having a doped surface layer;
a gate insulation film formed on the doped surface layer of the semiconductor substrate;
a gate electrode formed on the gate insulation film;
a channel area disposed in the doped surface layer of the semiconductor substrate below the gate electrode;
a pair of variable resistance areas formed on mutually opposite sides of the channel area in the doped surface layer, doped at a lower concentration than that of the channel area, the doping concentration in the variable resistance areas being at most five hundred quadrillion carriers per cubic centimeter ($5 \times 10^{17}$ cm$^{-3}$);
a pair of highly doped areas disposed on mutually opposite sides of the pair of variable resistance areas, and having a conductive type which is opposite to that of the channel area; and
a pair of charge storage bodies disposed above the pair of variable resistance areas on mutually opposite sides of the gate electrode for storing charge,
wherein the pair of variable resistance areas is doped with both p-type and n-type impurities, the p-type impurity having a concentration which is higher than that of the n-type impurity throughout the pair of variable resistance areas.

6. A memory cell, comprising:
a semiconductor substrate having a doped surface layer;
a gate insulation film formed on the doped surface layer of the semiconductor substrate;
a gate electrode formed on the gate insulation film;
a channel area disposed in the doped surface layer of the semiconductor substrate below the gate electrode;
a pair of variable resistance areas formed on mutually opposite sides of the channel area in the doped surface layer, doped at a lower concentration than that of the channel area, the doping concentration in the variable resistance areas being at most five hundred quadrillion carriers per cubic centimeter ($5 \times 10^{17}$ cm$^{-3}$);
a pair of highly doped areas disposed on mutually opposite sides of the pair of variable resistance areas, and having a conductive type which is opposite to that of the channel area; and
a pair of charge storage bodies disposed above the pair of variable resistance areas on mutually opposite sides of the gate electrode for storing charge,
wherein the pair of variable resistance areas are doped with both p-type and n-type impurities, the p-type impurity having a concentration which is higher than the n-type impurity in one part of the pair of variable resistance areas, the p-type impurity having a concentration which is lower than that of the n-type impurity in another part of the pair of variable resistance areas.

7. A memory cell, comprising:
a semiconductor substrate having a doped surface layer;
a gate insulation film formed on the doped surface layer of the semiconductor substrate;
a gate electrode formed on the gate insulation film;
a channel area disposed in the doped surface layer of the semiconductor substrate below the gate electrode;
a pair of variable resistance areas formed on mutually opposite sides of the channel area in the doped surface layer, doped at a lower concentration than that of the channel area, the doping concentration in the variable resistance areas being at most five hundred quadrillion carriers per cubic centimeter ($5 \times 10^{17}$ cm$^{-3}$);
a pair of highly doped areas disposed on mutually opposite sides of the pair of variable resistance areas, and having a conductive type which is opposite to that of the channel area;
a pair of charge storage bodies disposed above the pair of variable resistance areas on mutually opposite sides of the gate electrode for storing charge; and
a pocket layer that has a conductive type which is the same as that of the channel area, that is doped at a higher concentration than that of the channel area, and that is disposed below the pair of variable resistance areas.

8. The memory cell of claim 7, wherein the pocket layer is doped with boron.

9. The memory cell of claim 7, wherein the pocket layer is doped with indium.

10. A nonvolatile semiconductor memory formed in a semiconductor substrate having a doped surface layer, the nonvolatile semiconductor memory having a memory cell area with at least one memory cell and a peripheral area with at least one peripheral transistor, wherein the at least one memory cell comprises:

a first gate insulation film formed on the doped surface layer of the semiconductor substrate, a first gate electrode formed on the first gate insulation film, a first channel area disposed in the doped surface layer of the semiconductor substrate below the first gate electrode, a pair of variable resistance areas formed on mutually opposite sides of the first channel area in the doped surface layer and doped at a concentration which is lower than that of the first channel area, a pair of first highly doped areas disposed on mutually opposite sides of the pair of variable resistance areas, and having a conductive type which is opposite to that of the first channel area, and a pair of charge storage bodies disposed above the pair of variable resistance areas on mutually opposite sides of the first gate electrode for storing charge; and wherein the at least one peripheral transistor comprises:

a second gate insulation film formed on the doped surface layer of the semiconductor substrate, a second gate electrode formed on the second gate insulation film, a second channel area disposed in the doped surface layer of the semiconductor substrate below the second gate electrode, a pair of lightly doped drain (LDD) areas formed on mutually opposite sides of the second channel area in the doped surface layer, the doping of the LDD areas differing from the doping of the pair of variable resistance areas, and a pair of second highly doped areas disposed on mutually opposite sides of the pair of LDD areas, and having a conductive type which is opposite to that of the second channel area, wherein the pair of variable resistance areas is doped with an impurity having an atomic weight which is heavier than that of the impurity with which the LDD areas are doped.

11. The nonvolatile semiconductor memory of claim 10, wherein the pair of variable resistance areas has a doping concentration which is lower than that of the LDD areas.

12. The nonvolatile semiconductor memory of claim 10, wherein the pair of variable resistance areas has a doping concentration which is at most $5 \times 10^{17}$ cm$^{-3}$.

13. The nonvolatile semiconductor memory of claim 10, wherein the pair of variable resistance areas has a depth which is shallower than that of the LDD areas.

14. The nonvolatile semiconductor memory of claim 10, wherein the pair of variable resistance areas is formed with an ion implantation dose which is smaller than that with which the LDD areas are formed.

* * * * *